United States Patent
Kuwazawa et al.

(10) Patent No.: US 6,946,638 B2
(45) Date of Patent: Sep. 20, 2005

(54) SOLID-STATE IMAGING DEVICE AND METHOD OF DRIVING THE SAME

(75) Inventors: Kazunobu Kuwazawa, Chino (JP); Yutaka Maruo, Sakata (JP); Sanae Nishida, Suwa (JP); Yoshitaka Narita, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/936,226

(22) Filed: Sep. 8, 2004

(65) Prior Publication Data

US 2005/0087672 A1 Apr. 28, 2005

(30) Foreign Application Priority Data

Sep. 9, 2003 (JP) ........................................ 2003-316879

(51) Int. Cl.[7] ...................... H01L 27/00; H01L 31/062; H04N 3/14
(52) U.S. Cl. ................................ 250/208.1; 250/214.1; 348/299; 348/308; 257/292
(58) Field of Search .......................... 250/208.1, 214.1; 348/294, 297, 299, 300, 308; 257/290–293, 443, 448

(56) References Cited

U.S. PATENT DOCUMENTS 6,051,857 A * 4/2000 Miida ......................... 257/292

FOREIGN PATENT DOCUMENTS

JP 2002-134729 5/2002

* cited by examiner

*Primary Examiner*—Kevin Pyo
(74) *Attorney, Agent, or Firm*—Harness, Dickey & Pierce, P.L.C.

(57) ABSTRACT

A solid-state imaging device comprising: a photoelectric conversion element generating photo-generated charges; an accumulation well accumulating the charges; a modulation well holding the charges from the accumulation well; a modulation transistor controlled by the charges held in the modulation well and that outputs a signal corresponding to the charges; a transfer control element changing the potential barrier of a transfer channel between the accumulation and modulation wells to control transfer of the charges; an unwanted charges discharging control element controlling the potential barrier of an unwanted charges discharging channel coupled to the accumulation well, and discharging charges that overflow from the accumulation well during a period other than the transfer period when the photo-generated charges are transferred; and a residual charges discharging control element controlling the potential barrier of a residual charges discharging channel coupled to the modulation well, and discharging residual charges in the modulation well.

10 Claims, 20 Drawing Sheets

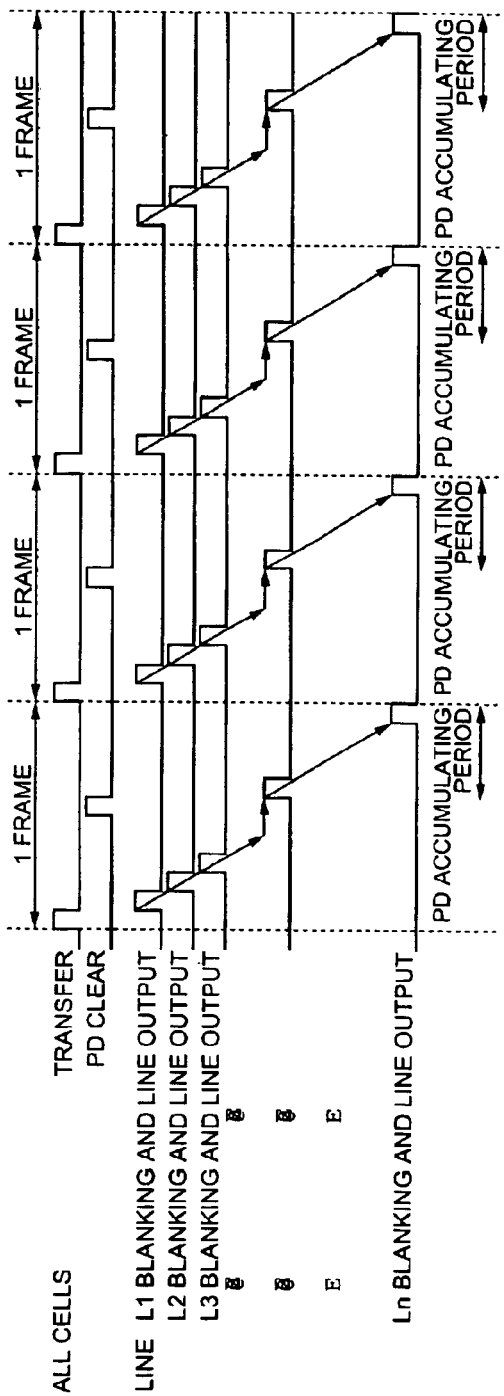
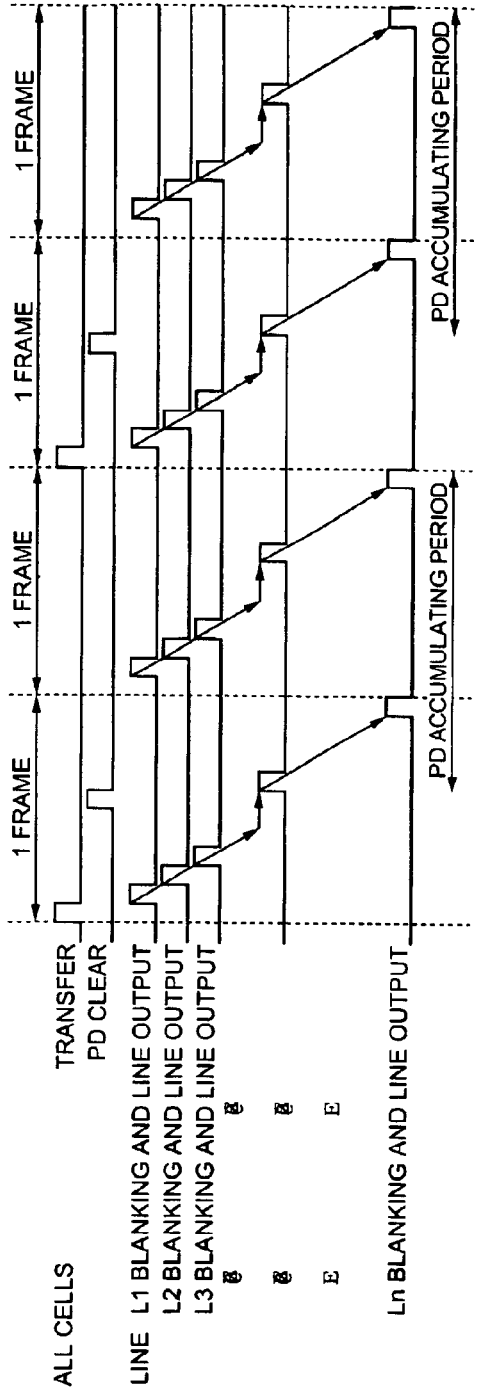
FIG. 10A
FIG. 10B

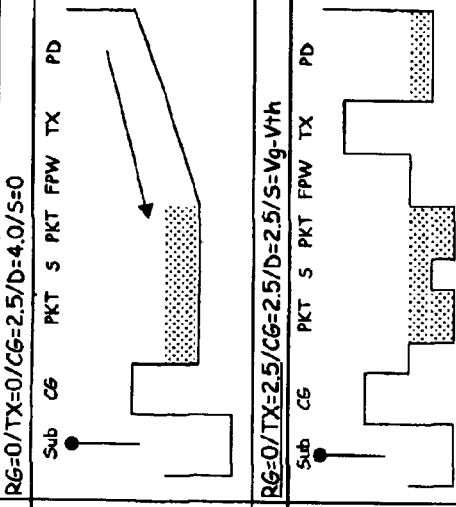

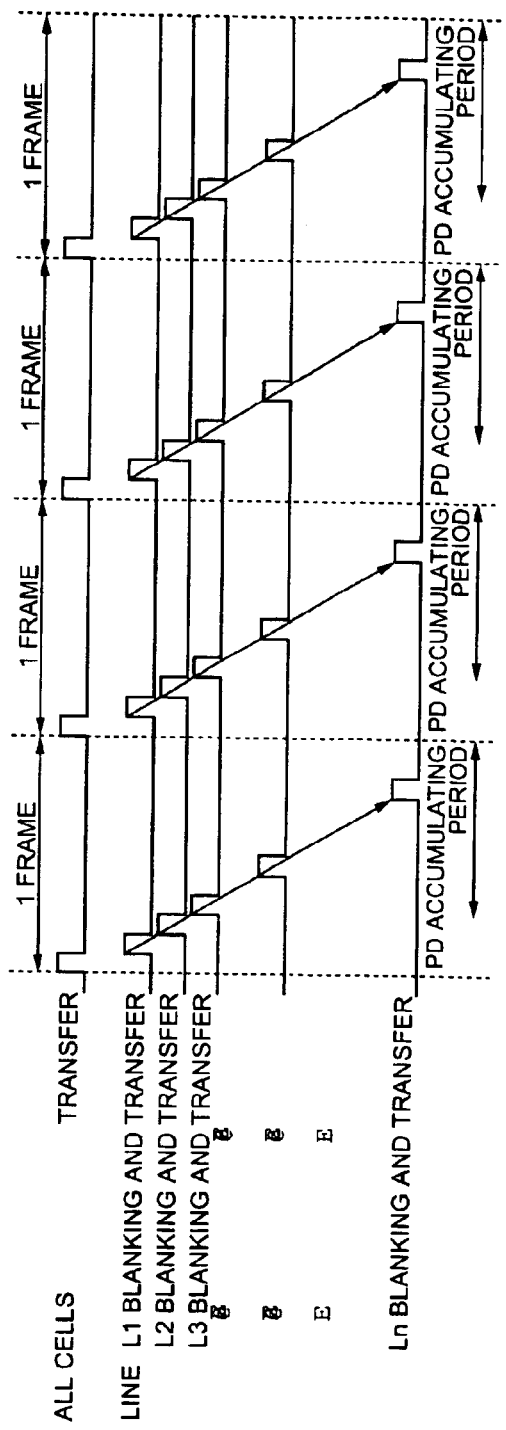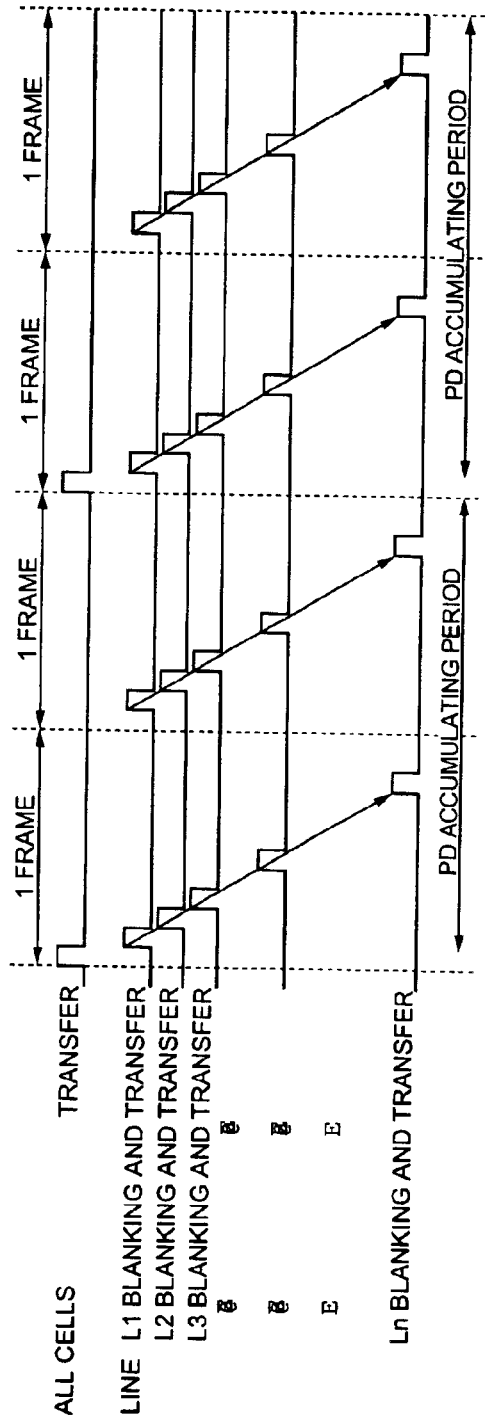
FIG. 20A
FIG. 20B

SOLID-STATE IMAGING DEVICE AND METHOD OF DRIVING THE SAME

RELATED APPLICATIONS

This application claims priority to Japanese Patent Application No. 2003-316879 filed Sep. 9, 2003 which is hereby expressly incorporated by reference herein in its entirety.

BACKGROUND

1. Filed of the Invention

The present invention relates to a solid-state imaging device having a high quality image and low power consumption, and a method of driving the same.

2. Background

As solid-state imaging devices mounted in cellular phones and so forth, there are a CCD (charge coupled device) type image sensor and a CMOS type image sensor. The CCD type image sensor is excellent in image quality, while the CMOS type image sensor consumes lower power and its process cost is low. In recent years, MOS type solid-state imaging devices using a threshold voltage modulation method that combines both high quality image and low power consumption have been proposed. The MOS type solid-state imaging device of the threshold voltage modulation method is disclosed in Japanese Unexamined Patent Publication No. 2002-134729, for example.

In the solid-state imaging device of Japanese Unexamined Patent Publication No. 2002-134729, image output is obtained by arranging unit pixels in a matrix and repeating three states of initialization, accumulation, and reading. Moreover, in the solid-state imaging device of Japanese Unexamined Patent Publication No. 2002-134729, each unit pixel has a photo-diode, a modulation transistor, and an overflow drain gate. The gate of the modulation transistor is formed in a ring shape.

Charges (photo-generated charges) generated by light incident upon a photo-diode are transferred to a P-type well region provided under a ring gate so as to be accumulated in a carrier pocket formed in this region. The threshold voltage of the modulation transistor changes corresponding to the photo-generated charges accumulated in the carrier pocket. Thus, a signal (pixel signal) corresponding to incident light is obtained from a terminal coupled to the source region of the modulation transistor.

In the solid-state imaging device of Japanese Unexamined Patent Publication No. 2002-134729, in order to prevent distortion caused when imaging a moving object, an image by an optical signal is captured at the entire light-receiving surface, and then the optical signal is converted into an electric signal so as to be taken out to the outside as an image signal. However, in this reading method, an accumulating period and a reading period cannot be controlled for each pixel because an image by an optical signal is captured at the entire light-receiving surface. Therefore, while specific pixels are being read, the accumulating operation cannot be carried out in other pixels. As a result, the frame rate cannot be enhanced.

In addition, in the solid-state imaging device of Japanese Unexamined Patent Publication No. 2002-134729, photo-generated charges accumulated in a carrier pocket are discharged toward an area under a P-type well via an N-type layer at an initialization time. In other words, the photo-generated charges are discharged toward a substrate via an N-type layer. Therefore, the P-type well having a carrier pocket is required to hold carriers in a reading period, and to discharge the carriers in a discharging period. In order to satisfy such a trade-off need, the thickness and impurity concentration of each impurity layer needs to be strictly controlled, and hence the versatility in the design is remarkably impaired.

Furthermore, in the solid-state imaging device of Japanese Unexamined Patent Publication No. 2002-134729, part of the photo-generated charges generated in a photo diode are discharged toward a substrate via an overflow drain region formed of a P-type layer.

Incidentally, in an N-type layer constituting a photo diode, as the peak of impurity concentration becomes deeper perpendicularly downward in the substrate, the wavelength range of photoelectric-convertible incident light becomes wider. That is, taking a higher quality image into consideration, the depth of the N-type layer needs to be deep enough. Meanwhile, the overflow drain region is made up of a deep P-type layer extending from under an overflow drain gate to the back surface of the substrate. This P-type layer is formed by implanting P-type impurities after forming the above N-type layer. Therefore, in order to form the overflow drain region made up of a deep P-type layer, ion-implanting energy needs to be large. Generally, the area of an impurity region formed with increased ion-implanting energy becomes large. That is, the area of the overflow drain region becomes large. Therefore, there is a trade-off relationship between a higher quality image and miniaturization, and there is also a problem in that a solid-state imaging device cannot be miniaturized if the N layer is deepened for achieving a higher quality image.

The present invention is made in view of such problems, and is intended to provide a solid-state imaging device and a method of driving the same that can attain a higher quality image and miniaturization without impairing the versatility in the design while enhancing the frame rate by allowing an accumulating period and a reading period to be set to a common timing.

SUMMARY

A solid-state imaging device according to one embodiment of the present invention comprises: a substrate; a photoelectric conversion element formed in the substrate and generating photo-generated charges corresponding to incident light; an accumulation well accumulating the photo-generated charges; a modulation well holding the photo-generated charges transferred from the accumulation well; and a modulation transistor whose channel threshold voltage is controlled by the photo-generated charges held in the modulation well, and that outputs a pixel signal corresponding to the photo-generated charges. The solid-state imaging device also comprises: a transfer control element changing a potential barrier of a photo-generated charges transfer channel between the accumulation well and the modulation well so as to control the transfer of the photo-generated charges; an unwanted charges discharging control element controlling a potential barrier of an unwanted charges discharging channel coupled to the accumulation well, the unwanted charges discharging control element discharging the photo-generated charges that overflow from the accumulation well through the unwanted charges discharging channel during a period other than a transfer period when the photo-generated charges are transferred from the accumulation well to the modulation well by the transfer control element; and a residual charges discharging control element controlling a potential barrier of a residual charges discharging channel coupled to the modulation well, and discharging residual charges in the modulation well through the residual charges discharging channel.

According to the embodiment of the present invention, a charges accumulating operation can be implemented in the accumulation well while the operation of reading a pixel signal is implemented in the modulation transistor. Namely, the reading operation and the accumulating operation can be set within the same period. Moreover, in the embodiment of the present invention, overflow charges that are generated in the accumulation well when a strong light enters or the like are discharged to the outside through the unwanted charges discharging channel. Thus, secure accumulation and reading are possible.

In addition, the residual charges discharging control element controls the potential barrier of the residual charges discharging channel so as to discharge charges that overflow from the modulation well through the residual charges discharging channel, during a period other than a transfer period when the photo-generated charges are transferred from the accumulation well to the modulation well by the transfer control element.

According to the embodiment of the present invention, the charges that overflow from the modulation well are discharged to the outside through the residual charges discharging channel without flowing into the accumulation well. Thus, even if the reading period and the accumulating period are set to a common timing, secure accumulation and reading can be attained.

Furthermore, the unwanted charges discharging control element determines an accumulating period of the photo-generated charges in the accumulation well by discharging the photo-generated charges accumulated in the accumulation well at a given timing.

According to the embodiment of the present invention, the photo-generated charges are securely accumulated in the accumulation well by controlling the potential barriers of the transfer channel and the unwanted charges discharging channel. By discharging the photo-generated charges accumulated in the accumulation well at a given timing, accumulation of the photo-generated charges into the accumulation well is initiated from this discharging timing. Accumulation of the photo-generated charges is completed by transferring the photo-generated charges accumulated in the accumulation well to the modulation well through the transfer channel in the transfer period. Thus, by discharging the photo-generated charges through the unwanted charges discharging channel, the accumulating period can be set without restraint, such that imaging not only in a normal mode but in a high-speed shutter mode and in a low-speed shutter mode becomes possible.

In addition, the residual charges discharging channel is formed substantially parallel to a surface of the substrate.

According to the embodiment of the present invention, the residual charges remaining in the modulation well are discharged through the residual charges discharging channel that is formed substantially parallel to the substrate surface. Therefore, in the modulation transistor forming region, there is no need to form a discharge channel for residual charges along the substrate depth direction, and thus the versatility in terms of design of an impurity profile in the modulation transistor forming region can be enhanced.

Furthermore, the residual charges discharging channel and the unwanted charges discharging channel are electrically coupled to a wiring layer formed above the substrate.

According to the embodiment of the present invention, the charges accumulated in the accumulation well are discharged from the unwanted charges discharging channel to a wire electrically coupled to the unwanted charges discharging channel. Charges accumulated in the modulation well are discharged from the residual charges discharging channel to a wire electrically coupled to the residual charges discharging channel. Therefore, it is not necessary to form a discharge channel by a diffusion layer in the depth direction of the substrate. Accordingly, even if the depth of the substrate in a photoelectric conversion element forming region is deepened for attaining a higher quality image, a large area is not required for the discharge channel such that miniaturization can be attained.

A method of driving a solid-state imaging device according to another embodiment of the present invention is a method of driving a solid-state imaging device that includes: an accumulation well that accumulates photo-generated charges generated by a photoelectric conversion element corresponding to incident light; a modulation well that controls a threshold voltage of a channel of a modulation transistor by holding the photo-generated charges; a transfer control element that controls a potential barrier of a transfer channel between the accumulation well and the modulation well; an unwanted charges discharging control element that controls a potential barrier of an unwanted charges discharging channel coupled to the accumulation well; and a residual charges discharging control element that controls a potential barrier of a residual charges discharging channel coupled to the modulation well. The method comprises: a single accumulation procedure for controlling the potential barriers of the transfer channel and the unwanted charges discharging channel with the transfer control element and the unwanted charges discharging control element, so as to accumulate the photo-generated charges by the photoelectric conversion element into the accumulation well at least so that the photo-generated charges do not flow to the modulation well through the transfer channel; and a reading procedure. The reading procedure comprises: a signal component modulation procedure for, in a state in which the photo-generated charges are held in the modulation well by controlling the potential barriers of the residual charges discharging channel and the transfer channel with the residual charges discharging control element and the transfer control element, outputting a pixel signal corresponding to the photo-generated charges from the modulation transistor; a discharge procedure for discharging residual charges in the modulation well through the residual charges discharging channel by controlling the potential barrier of the residual charges discharging channel with the residual charges discharging control element; and a noise component modulation procedure for controlling the potential barriers of the residual charges discharging channel and the transfer channel with the residual charges discharging control element and the transfer control element, and reading a noise component from the modulation transistor after the discharge procedure. The method also comprises: a parallel accumulation procedure for, during the same period as the signal component modulation procedure, the discharge procedure, and the noise component modulation procedure, controlling the potential barriers of the transfer channel and the unwanted charges discharging channel with the transfer control element and the unwanted charges discharging control element so as to accumulate the photo-generated charges by the photoelectric conversion element into the accumulation well at least so that the photo-generated charges do not flow to the modulation well through the transfer channel; and a transfer procedure for controlling the potential barrier of the transfer channel with the transfer control element so as to transfer the photo-generated charges accumulated in the accumulation well to the modulation well and make the photo-generated charges be held therein.

According to the embodiment of the present invention, in the single accumulation procedure, the photo-generated charges generated by the photoelectric conversion element are accumulated in the accumulation well at least without flowing into the modulation well side. Moreover, the parallel accumulation procedure is carried out in the same period as the reading procedure including the signal component modulation procedure for outputting a pixel signal corresponding to the photo-generated charges from the modulation transistor the discharge procedure for discharging the residual charges in the modulation well through the residual charges discharging channel, and the noise component modulation procedure for reading a noise component from the modulation transistor after the discharge procedure. Accordingly, photo-generated charges by the photoelectric conversion element are accumulated in the accumulation well, at least without flowing into the modulation well through the transfer channel. The photo-generated charges accumulated in the accumulation well in these single accumulation and parallel accumulation procedures are transferred to the modulation well and held therein in the transfer procedure. The reading corresponding to the photo-generated charges held in the modulation well is carried out in the reading procedure. During the reading period in the reading procedure, the accumulation of the photo-generated charges is carried out simultaneously, thereby enabling enhancement of the frame rate.

The transfer procedure is carried out after the single accumulation procedure and the parallel accumulation procedure carried out in the same period as the reading procedure are repeated a number of times based on a number of lines in one screen.

According to the embodiment of the present invention, the accumulating operation in the single accumulation procedure and the parallel accumulation procedure are carried out simultaneously with the reading of all lines that is carried out from the transfer procedure to the following transfer procedure. Accumulation in one screen period except the transfer period can be carried out.

In addition, the method of driving a solid-state imaging device further comprises an initialization procedure for controlling the potential barriers of the transfer channel and the unwanted charges discharging channel with the transfer control element and the unwanted charges discharging control element during an arbitrary period within one screen period, so as to discharge the photo-generated charges accumulated in the accumulation well through the unwanted charges discharging channel. The transfer procedure is carried out after the single accumulation procedure and the parallel accumulation procedure carried out in the same period as the reading procedure are repeated a number of times based on a number of lines in one screen and timing within the one screen period in the initialization procedure.

According to the embodiment of the present invention, by discharging the photo-generated charges accumulated in the accumulation well in an arbitrary period within one screen period, the accumulation of the photo-generated charges into the accumulation well is initiated from the completion timing of this arbitrary period. Accumulation of the photo-generated charges is completed upon the photo-generated charges accumulated in the accumulation well being transferred to the modulation well through the transfer channel. Thus, corresponding to the timing of discharging the photo-generated charges through the unwanted charges discharging channel, the accumulating period can be set without restraint, such that imaging not only in a normal mode but in a high-speed shutter mode and in a low-speed shutter mode becomes possible.

In addition, a high-speed shutter mode in which a period from the initialization procedure to the transfer procedure is shorter than one screen period is included.

According to the embodiment of the present invention, the accumulating period can be shortened, and even if extremely bright light enters, the entire image can be prevented from becoming whitish (washed-out) and degrading the contrast thereof.

Furthermore, a low-speed shutter mode in which a period from the initialization procedure to the transfer procedure is longer than one screen period is included.

According to the embodiment of the present invention, the accumulating period can be extended, and even if incident light is extremely dark, an image with sufficient brightness can be obtained.

BRIEF DESCRIPTION OF THE DRAWINGS

FIGS. 10A and 10B are timing charts showing a driving sequence.

FIGS. 18A through 18D are diagrams showing the potential relationship for each period of the second embodiment.

FIGS. 20A and 20B are timing charts showing the driving sequence of the second embodiment.

DETAILED DESCRIPTION

Figure 1:
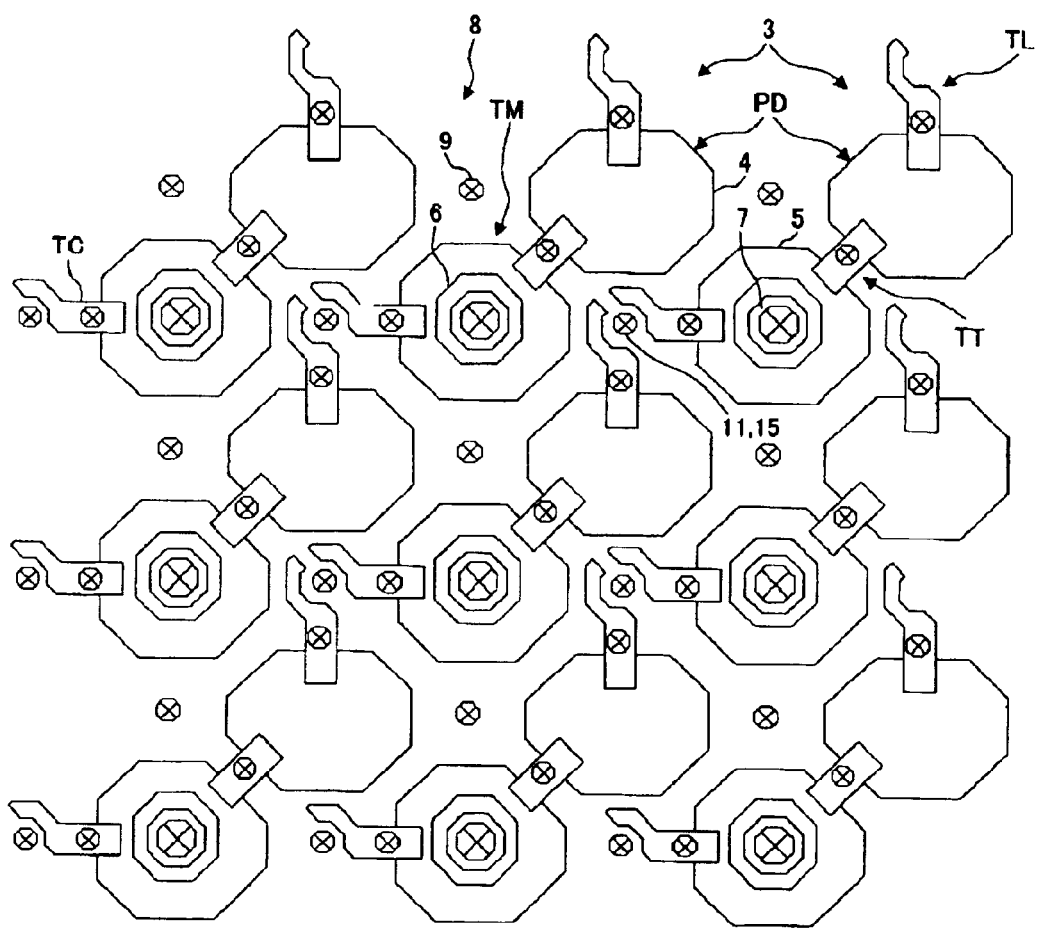
FIG. 1 is a plan view showing the planar shape of a solid state-imaging device according to a first embodiment of the present invention.
Figure 2:
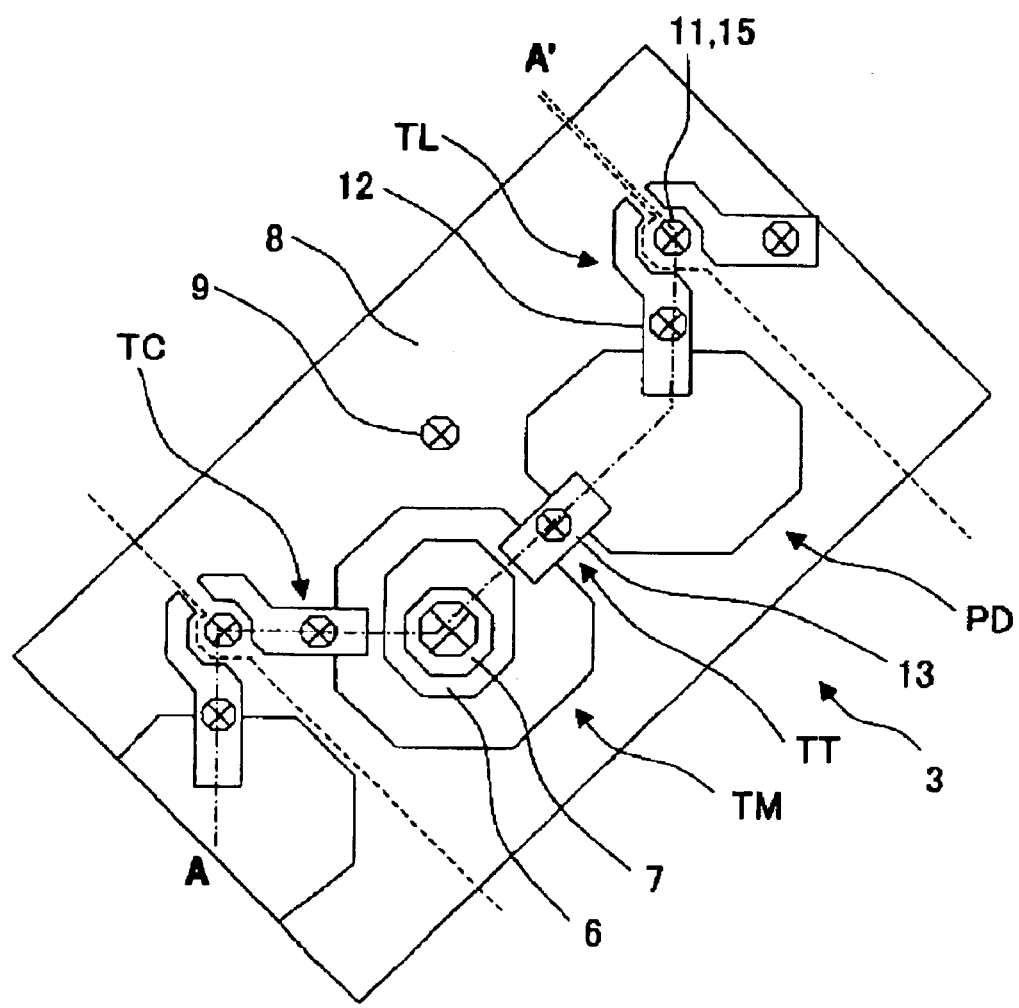
FIG. 2 is a plan view showing the planar shape of one cell of FIG. 1.
Figure 3:
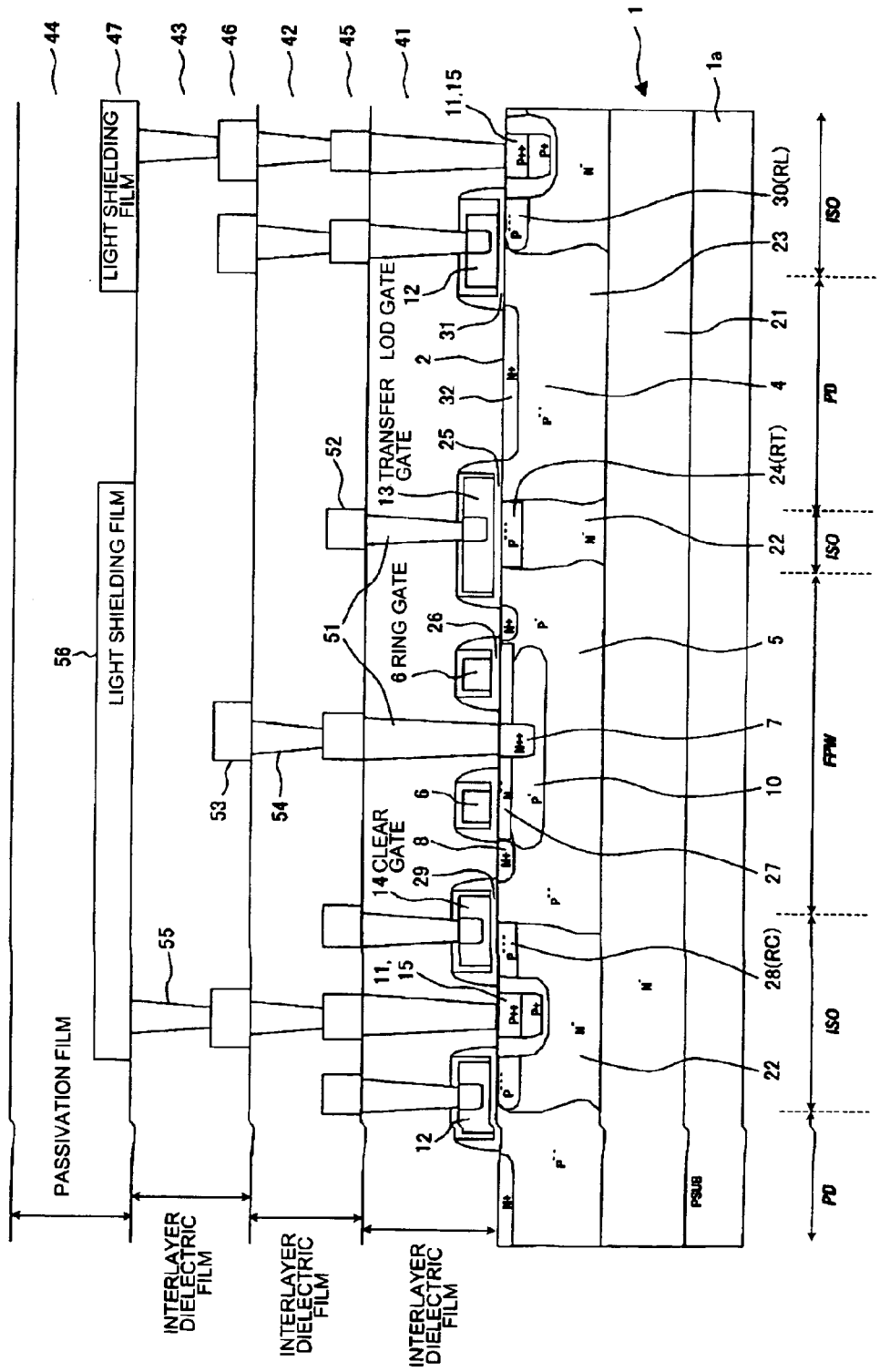
FIG. 3 is a sectional view showing the section cut along the A–A' line of FIG. 2.
Figure 4:
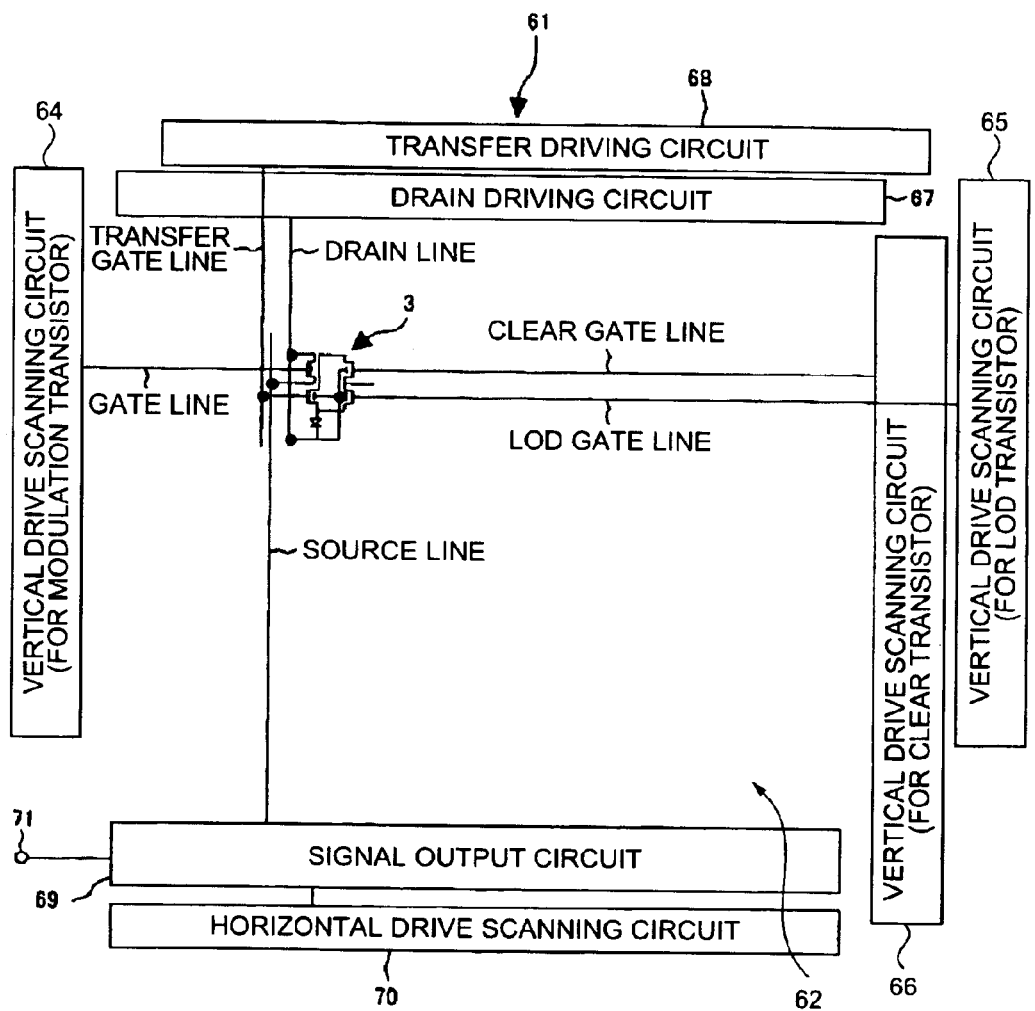
FIG. 4 is a block diagram showing the entire structure of the element.
Figure 6:
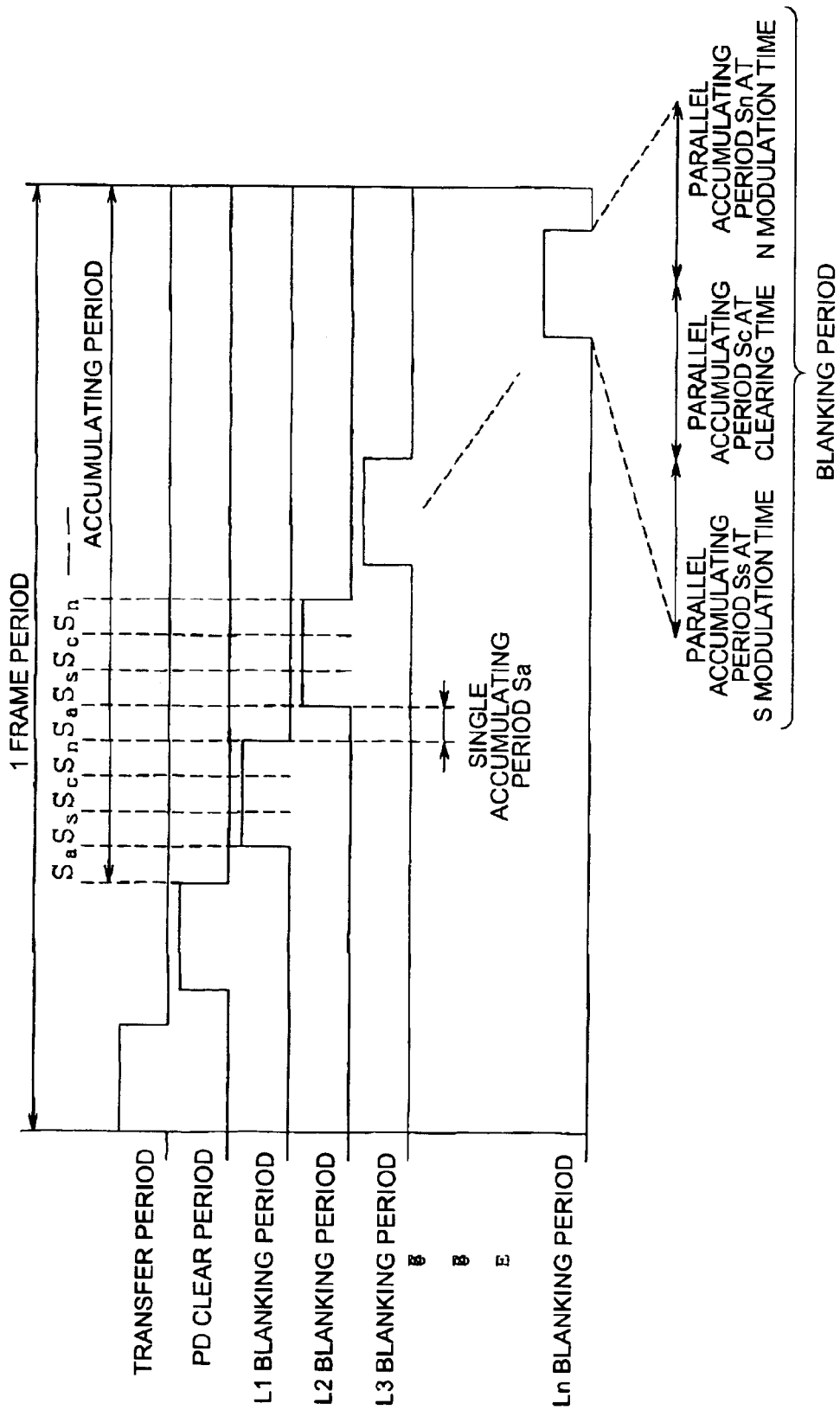
FIG. 6 is a timing chart for illustrating the outline of each driving period in the first embodiment.
Figure 7:
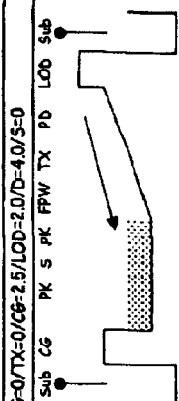
FIGS. 7A through 7E are diagrams showing the potential relationship for each period.
Figure 8:
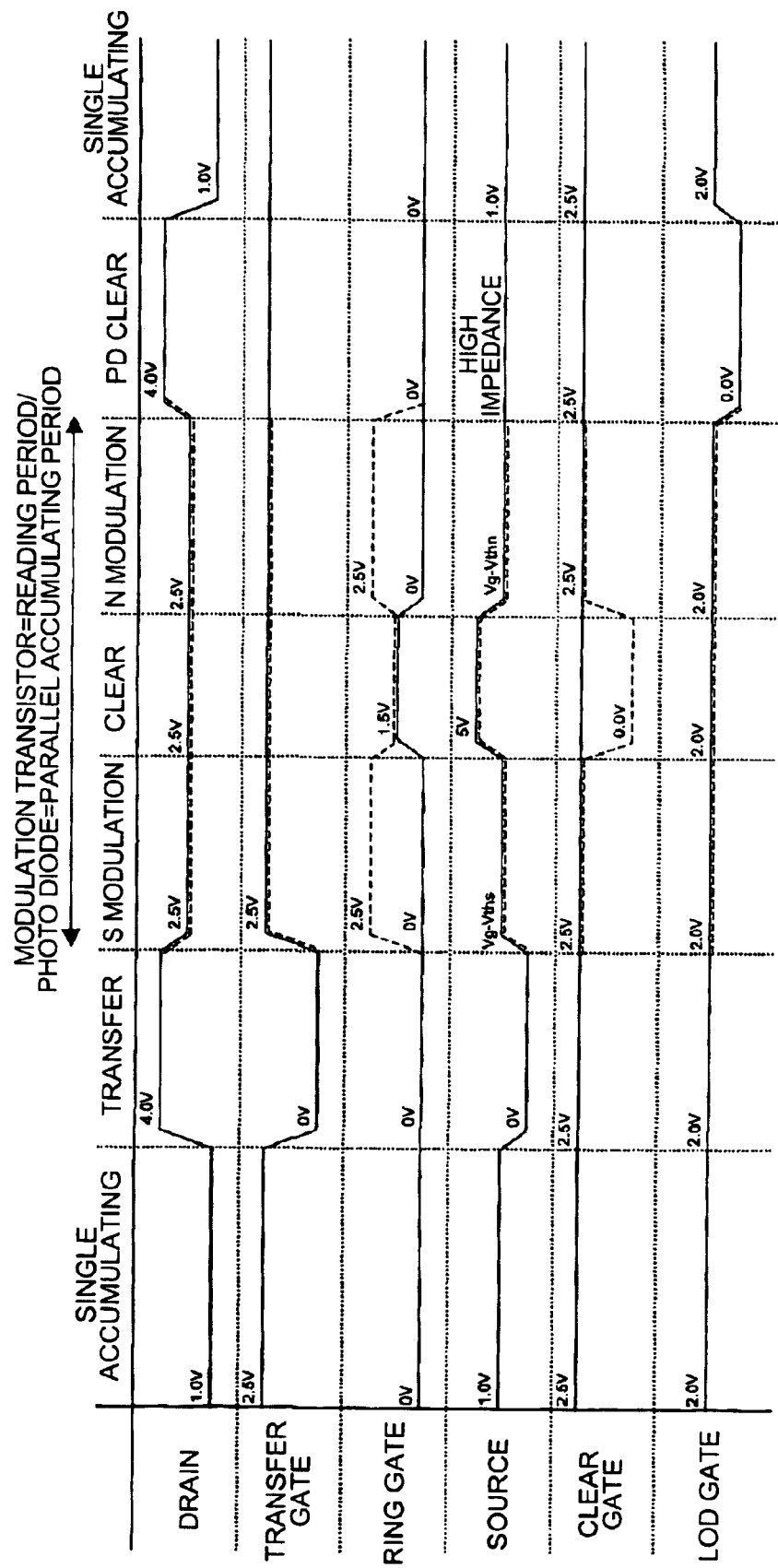
FIG. 8 is a diagram showing changes of the driving voltage in each period in the driving sequence.
Figure 9:
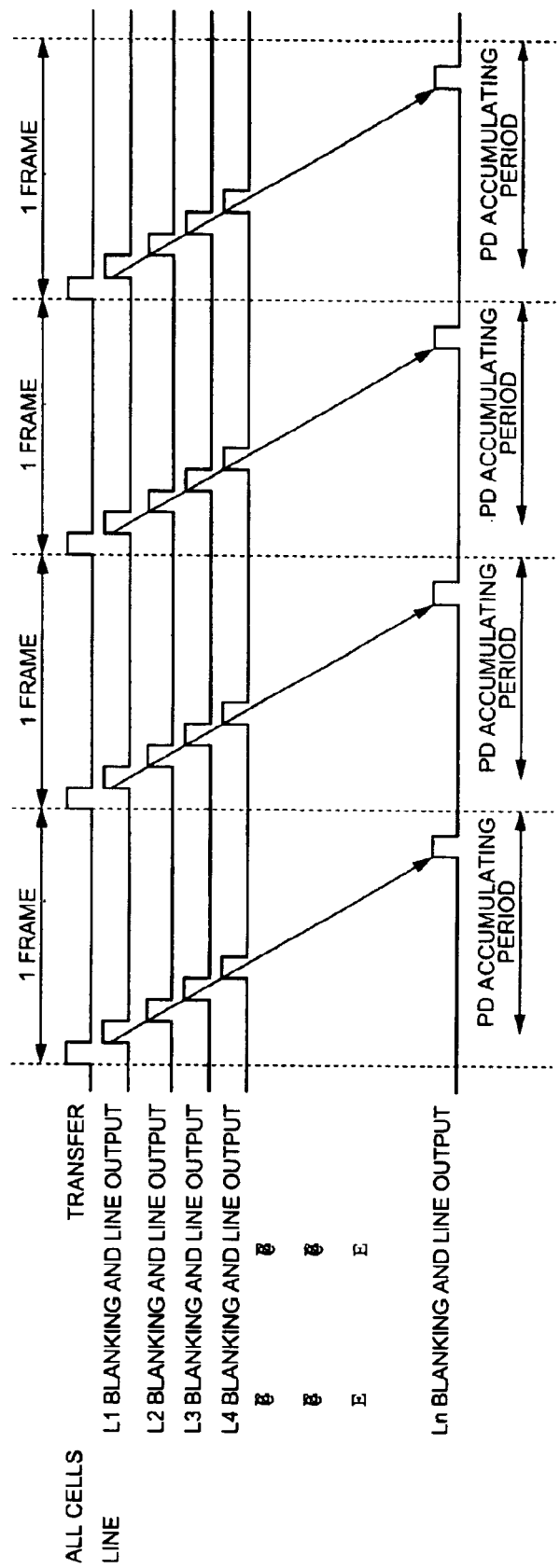
FIG. 9 is a timing chart showing a driving sequence.

Embodiments of the present invention will now be described in detail below with reference to the drawings. FIGS. 1 through 13 relate to a first embodiment of the present invention. FIG. 1 is a plan view showing a planar shape of a solid-state imaging device of the present embodiment. FIG. 2 is a plan view showing a planar shape of one cell of FIG. 1. FIG. 3 is a sectional view showing a section cut along the A–A' line of FIG. 2. FIG. 4 is a block diagram showing the entire structure of the element. FIG. 5 is an equivalent circuit diagram of a sensor cell. FIG. 6 is a timing chart for illustrating the outline of each driving period in the present embodiment. FIG. 7 is an explanatory diagram showing the potential relationship for the same period of each section. FIG. 8 is an explanatory diagram showing changes of the driving voltage for each period in the driving sequence. FIGS. 9 and 10 are timing charts showing the driving sequences. FIGS. 11 through 13 are process diagrams for illustrating a manufacturing method of the element.

The solid-state imaging device of the present embodiment includes a photoelectric conversion element, an accumulation well, a modulation well, and a modulation transistor. In the present embodiment, the photoelectric conversion element is a photo-diode. The accumulation well is provided in a photoelectric conversion element forming region, and accumulates charges generated bad the photoelectric conversion element (hereinafter, referred to as photo-generated charges). The modulation well is provided in the modulation transistor forming region, and holds the photo-generated charges transferred from the accumulation well. The threshold of the modulation transistor is modulated by the photo-generated charges held in the modulation well, based on which the modulation transistor outputs a pixel signal.

Moreover, the solid-state imaging device of the present embodiment includes a photo-generated charges transfer channel and a transfer control element. The photo-generated charges transfer channel is provided between the accumulation well and the modulation well. The photo-generated charges are transferred from the accumulation well to the modulation well through the photo-generated charges transfer channel. The transfer control element controls the potential barrier of the photo-generated charges transfer channel so as to move photo-generated charges from the accumulation well to the modulation well. In the present embodiment, the transfer control element is a transfer transistor. The accumulation well and the modulation well are isolated from each other in terms of potential by the transfer control element. Accordingly, the accumulating period and the reading period (hereinafter, also referred to as a blanking period) can be set within the same period, and thus the frame rate can be enhanced.

Furthermore, the solid-state imaging device of the present embodiment includes a residual charges discharging channel, a contact region for discharging residual charges, and a residual charges discharging control element. The residual charges discharging channel is provided between the modulation well and the contact region for discharging residual charges, and is provided substantially parallel to the substrate surface. The residual charges discharging channel is electrically coupled to a wiring layer provided on the substrate with the contact region for discharging residual charges therebetween. Charges remaining in the modulation well (referred to as residual charges hereinafter) pass through the residual charges discharging channel so as to be transferred from the modulation well to the contact region for discharging residual charges. The contact region for discharging residual charges is formed inside the residual charges discharging channel. The residual charges discharging control element controls the potential barrier of the residual charges discharging channel so as to discharge residual charges from the modulation well to the wiring layer. In the present embodiment, the residual charges discharging control element is a clear transistor. The important point is that residual charges are not directly discharged perpendicularly downward in the substrate from the modulation well. That is, the residual charges are moved substantially parallel to the substrate surface, namely moved in a substrate lateral direction, and thereafter are discharged toward the wiring layer formed on the substrate. This enables the versatility in the potential design to be enhanced in the modulation transistor forming region.

Furthermore, the solid-state imaging device of the present embodiment includes an unwanted charges discharging channel, a contact region for discharging unwanted charges, and an unwanted charges discharging control element. The unwanted charges discharging channel is provided between the accumulation well and the contact region for discharging unwanted charges, and is provided substantially parallel to the substrate surface. The unwanted charges discharging channel is electrically coupled to a wiring layer provided on the substrate with the contact region for discharging unwanted charges therebetween. Charges that are unnecessary and overflow from the accumulation well instead of being accumulated in the accumulation well and thus do not contribute to an image signal (hereinafter, referred to as unwanted charges), are transferred to the contact region for discharging unwanted charges from the accumulation well through the unwanted charges discharging channel. The contact region for discharging unwanted charges is formed inside the unwanted charges discharging channel. The unwanted charges discharging control element controls the potential barrier of the unwanted charges discharging channel so as to discharge unwanted charges from the accumulation well to the wiring layer. In the present embodiment, the unwanted charges discharging control element is a lateral-overflow-drain (hereinafter, referred to as LOD) transistor. The unwanted charges are not directly discharged perpendicularly downward in the substrate from either one of the accumulation well and the contact region for discharging unwanted charges. That is, unwanted charges are moved substantially parallel to the substrate surface, namely moved in a substrate lateral direction, and thereafter are discharged to the wiring layer formed on the substrate. Accordingly, miniaturization can be attained, even if the depth of the impurity layer in the photoelectric conversion element forming region is deepened to attain higher quality image.

Structure of Sensor Cell

The solid-state imaging device according to the present embodiment has a sensor cell array in which sensor cells, which are unit pixels, are arranged in a matrix, as described later. Each sensor cell accumulates photo-generated charges generated corresponding to incident light, and outputs an image signal of a level based on the accumulated photo-generated charges. Image signals of one screen is obtained by arranging the sensor cells in a matrix.

First, the structure of each sensor cell will be described with reference to FIGS. 1 through 3. FIG. 1 shows sensor cells of three horizontal pixels×three perpendicular pixels, and FIG. 2 shows one sensor cell. Here, one sensor cell is within a region shown with the dashed lines of FIG. 2. In the present embodiment, an example in which holes are used as photo-generated charges is shown. In the case of using electrons as photo-generated charges, the same configuration is also possible. Moreover, FIG. 3 shows a sectional structure of the cell cut along the A–A' line of FIG. 2.

As shown in the plan views of FIGS. 1 and 2, a photo-diode PD and a modulation transistor TM are adjacently formed in a sensor cell 3, which is a unit pixel. As the modulation transistor TM, an N-channel depletion MOS transistor is used, for example. The unit pixel has a substantially rectangular shape, each side of which is inclined to the column or row direction of the sensor cell array.

In a photo-diode PD forming region (PD of FIG. 3), an opening region 2 is formed in the surface of a substrate 1, and an accumulation well 4 that is a P-type well with a region larger than the opening region 2 is formed in the relatively shallow position of the substrate 1 surface. A modulation well 5 that is a P-type well is formed in a modulation transistor TM forming region (FPW of FIG. 3) with a predetermined interval from the accumulation well 4.

Above the modulation well 5, a ring-shaped gate (ring gate) 6 is formed above the substrate 1 surface, and a source region 7 that is a highly doped N-type region is formed in the region near the substrate 1 surface of the opening portion at the center of the ring gate 6. An N-type drain region 8 is formed in the surroundings of the ring gate 6. A drain contact region 9 of an N$^+$ layer is formed at a predetermined position in the drain region 8, near the substrate 1 surface.

The modulation well 5 controls the threshold voltage of the channel of the modulation transistor TM. In the modulation well 5, a carrier pocket 10 (FIG. 3) that is a P-type high concentration region is formed under the ring gate 6. The modulation transistor TM is made up of the modulation well 5, the ring gate 6, the source region 7, and the drain region 8, and the threshold voltage of the channel thereof changes corresponding to the charges accumulated in the modulation well 5 (carrier pocket 10).

A depletion region (not shown) is formed in the boundary region between the P-type accumulation well 4 and an N-type well 21 to be described later that is formed in the substrate 1 under the opening region 2 of the photo diode PD, and photo-generated charges generated by light incident through the opening region 2 are generated in this depletion region In the present embodiment, the photo-generated charges that have been generated are accumulated in the accumulation well 4.

The charges accumulated in the accumulation well 4 are transferred to the modulation well 5 so as to be held in the carrier pocket 10. Accordingly, the source potential of the modulation transistor TM becomes one corresponding to the amount of the charges transferred to the modulation well 5, that is, corresponding to the light incident upon the photo diode PD.

A contact region 11 for discharging unwanted charges including overflow charges (hereinafter, referred to as an OD contact region), is formed by a high concentration P-type diffusion layer in the substrate 1 surface near the accumulation well 4. Above the substrate 1 surface between the OD contact region 11 and the accumulation well 4 region, formed is an LOD gate 12 of an LOD transistor TL for forming a channel RL (hereinafter, referred to as unwanted charges discharging channel) for unwanted charges including the charges that overflow between the OD contact region 11 and the accumulation well 4 region. Here, one end of the LOD gate two-dimensionally hangs over the accumulation well 4 region.

In the present embodiment, a transfer transistor TT is formed between the accumulation well 4 and the modulation well 5. A transfer gate 13 of the transfer transistor TT is formed above the substrate 1 surface on a channel RT between the accumulation well 4 and the modulation well 5 (hereinafter, simply referred to a transfer channel). The transfer of charges from the accumulation well 4 to the modulation well 5 can be controlled by controlling the potential barrier of the transfer channel RT with the transfer transistor TT.

In addition, in the present embodiment, a contact region 15 for discharge (hereinafter, referred to as a discharge contact region) is formed by a high concentration P-type diffusion layer in the substrate surface near the modulation well 5. Above the substrate 1 surface between the discharge contact region 15 and the modulation well 5 region, formed is a clear gate 14 of a clear transistor TC for controlling the potential barrier of a channel RC (hereinafter, referred to as residual charges discharging channel) between the discharge contact region 15 and the modulation well 5 region. Here, one end of the clear gate 14 two-dimensionally hangs over the modulation well 5 region.

Section of Sensor Cell

Furthermore, with reference to FIG. 3, the sectional structure of the sensor cell 3 will be described in detail. Incidentally, the subscripts, "–" and "+", of N and P in FIG. 3 indicate the state of a portion, depending on the number of the subscript, from a lower impurity concentration (subscript ---) to a higher impurity concentration (subscript +++).

FIG. 3 shows one unit pixel (cell) and the photo-diode PD forming region (PD) of a pixel adjacent to this cell. One cell includes the photo-diode PD forming region (PD) and the modulation transistor TM forming region (FPW). An isolation region (ISO) is provided between the photo-diode PD forming region and the modulation transistor TM forming region in one cell and between adjoining cells.

At a relatively deep position in the substrate 1, the N-type well 21 of N$^-$ is formed over the entire P-type substrate 1$a$. An isolation region 22 for isolating elements is formed by an N$^-$ layer on the N-type well 21. On the N-type well 21, a P$^{--}$ layer 23 is formed across all elements except the isolation region 22.

The P$^{--}$ layer 23 in the photo-diode PD forming region functions as the accumulation well 4. The P$^{--}$ layer 23 in the modulation transistor TM forming region functions as the modulation well 5, and in this modulation well 5, the carrier pocket 10 by P$^-$ diffusion is formed.

The transfer transistor TT is formed, on the substrate surface side, above the isolation region 22 between the photo-diode PD forming region and the modulation transistor TM forming region in one cell. The transfer transistor TT is constituted by forming a P$^{---}$ diffusion layer 24 that constitutes a channel in the substrate surface, and the transfer gate 13 above the substrate surface with a gate dielectric film 25 therebetween. The P$^{---}$ diffusion layer 24, being coupled to the accumulation well 4 and the modulation well 5, constitutes the transfer channel RT, and the potential barrier of this transfer channel RT is controlled corresponding to the applied voltage to the transfer gate 13.

In the modulation transistor TM forming region, the ring gate 6 is formed above the substrate surface with a gate dielectric film 26 therebetween, and an N$^{--}$ diffusion layer 27 that constitutes a channel is formed in the substrate surface under the ring gate 6. An N$^{++}$ diffusion layer is formed in the substrate surface at the center of the ring gate 6 so as to constitute the source region 7. Moreover, an N$^+$ diffusion layer is formed in the substrate surface in the periphery of the ring gate 6 so as to constitute the drain region 8. The N⁻⁻ diffusion layer 27 that constitutes a channel is coupled to the source region 7 and the drain region 8.

Above the isolation region 22 between the photo-diode PD forming region and the modulation transistor TM forming region of adjoining cells, the discharge contact region 15 and the OD contact region 11 are formed on the substrate surface side. In the present embodiment, one element is used both as the discharge contact region 15 and the OD contact region 11. However, these regions may be formed as separate elements. The discharge and OD contact regions 15 and 11 are obtained by forming a P⁺⁺ diffusion layer in the substrate surface.

The clear transistor TC is formed on the substrate surface side between the modulation transistor TM forming region and the discharge and OD contact regions 15 and 11. The clear transistor TC is constituted by forming a P⁻⁻⁻ diffusion layer 28 that constitutes a channel in the substrate surface between the modulation transistor TM forming region and the discharge and OD contact regions 15 and 11, and forming the clear gate 14 above the substrate surface with a gate dielectric film 29 therebetween. This P⁻⁻⁻ diffusion layer 28, being coupled to the modulation well 5 and the discharge and OD contact regions 15 and 11, constitutes the residual charges discharging channel RC, and the potential barrier of this residual charges discharging channel RC is controlled corresponding to the applied voltage to the clear gate 14.

The LOD transistor TL is formed on the substrate surface side between the photo-diode PD forming region and the discharge and OD contact regions 15 and 11. The LOD transistor TL is constituted by forming a P⁻⁻⁻ diffusion layer 30 that constitutes a channel in the substrate surface between the photo-diode PD forming region and the discharge and OD contact regions 15 and 11, and forming the LOD gate 12 above the substrate surface with a gate dielectric film 31 therebetween. This P⁻⁻⁻ diffusion layer 30, being coupled to the accumulation well 4 and the discharge and OD contact regions 15 and 11, constitutes the unwanted charges discharging channel RL, and the potential barrier of this unwanted charges discharging channel RL is controlled corresponding to the applied voltage to the LOD gate 12.

In addition, an N⁺ diffusion layer 32 is formed on the substrate surface side of the photo-diode PD forming region.

A lower wiring layer 45 is formed above the substrate surface with an interlayer dielectric film 41 therebetween. An upper wiring layer 46 is formed above the lower wiring layer 45 with an interlayer dielectric film 42 therebetween. In addition, a light shielding layer 47 is formed above the upper wiring layer 46 with an interlayer dielectric film 43 therebetween. A passivation film 44 is formed on the light shielding layer 47. The clear gate 14, the LOD gate 12, the transfer gate 13, the discharge and OD contact regions 15 and 11, and the source region 7 are electrically coupled to each wire 52 of the lower wiring layer 45 by contact holes 51 opened in the interlayer dielectric film 41. Each of the wires 52 and 53 of the lower and upper wiring layers 45 and 46, respectively, is made of a metal material such as aluminum.

Furthermore, each wire 52 of the lower wiring layer 45 and each wire 53 of the upper wiring layer 46 are electrically coupled to each other via contact holes 54 formed in the interlayer dielectric film 42. In addition, contact holes 55 for coupling a light shielding film 56 formed in the light shielding layer 47 and one wire of the upper wiring layer 46 are opened in the interlayer dielectric film 43, and thus the discharge and OD contact regions 15 and 11 are coupled to the light shielding film 56 with the lower and upper wiring layers 45 and 46 therebetween.

In the present embodiment, the potential barriers of the transfer channel RT, the residual charges discharging channel RC, and the unwanted charges discharging channel RL are controlled by independently controlling the transfer transistor TT, the clear transistor TC, and the LOD transistor TL. The ups and downs (rising and lowering) of the potentials of these channels, RT, RC, and RL, will now be described with reference to the potentail of a hole. In the accumulating period, the potentials of the transfer channel RT, the residual charges discharging channel RC, and the unwanted charges discharging channel RL are set high enough to allow photo-generated charges (in the case of a hole) to be accumulated, while the potentials of the residual charges discharging channel RC and the unwanted charges discharging channel RL are set to be lower than the potential of the transfer channel RT. Hereinafter, the ups and downs of the potential is described with reference to the potentail of a hole, not to the potentail of an electron.

Operation

The accumulating period and the blanking period can be carried out in the same period by using the sensor cells thus constituted.

Comparison with Conventional Example

In the device of the above mentioned Japanese Unexamined Patent Publication No. 2002-134729, under the photo diode forming region and the ring gate of the modulation transistor, first and a second well regions of P-type are integrally formed in a planar shape that is approximately the same as that of the opening region of the photo diode and the ring gate. Then, photo-generated charges generated by light incident from the opening region of the photo-diode are transferred from the first well region to the second well region under the ring gate so as to be accumulated in the carrier pocket with a low potential (with reference to a hole) formed in this portion.

In such a device of Japanese Unexamined Patent Publication No. 2002-134729, the accumulation and the reading can also be carried out with shifting, within one frame period, the lines to be initialized using a focal-plane shutter. However, in this case, each cell has a different timing for the accumulating period for each line such that the sampling timing of an image deviates in the vertical direction. Therefore, if an object to be imaged moves, the deviation of sampling timing of an image in the vertical direction causes distortion in the image. Especially, in the case in which the number of lines is large because of a high resolution requirement, the time deviation increases between the upper and lower lines such that distortion becomes conspicuous.

Thus, in Japanese Unexamined Patent Publication No. 2002-134729, the accumulating period of all of the cells is set to a common period. Namely, during the accumulating period, the potential barrier between the first well region and the second well region integrally formed is lowered by the transfer gate. According to this, the photo-generated charges are transferred from the first well region to the second well region, and keep on being accumulated in the carrier pocket. Upon completion of the accumulating period, the pixel signal corresponding to the charges in the carrier pocket is output in the reading period. In the device of Japanese Unexamined Patent Publication No. 2002-134729, in this reading period, photo-generated charges generated in a light-receiving region are discharged to a substrate through an overflow drain region, thereby enabling the accumulation of only effective photo-generated charges in the accumulating period. In the device of Japanese Unexamined Patent Publication No. 2002-134729, since the potential design is required to enable such operation, the veritably in terms of the potential design is remarkably low.

On the other hand, in the present embodiment, the accumulating period and the reading period are set to be a common period. Namely, during the accumulating period, the potential barriers of the transfer channel RT, residual charges discharging channel RC, and the unwanted charges discharging channel RL are set to a sufficiently high potential by independently controlling the transfer transistor TT, the clear transistor TC, and the LOD transistor TL. Moreover, the potentials of the residual charges discharging channel RC and the unwanted charges discharging channel RL are set to be lower than the potential of the transfer channel RT during the period other than the transfer period, which will be described later, for example, during the accumulating period. Thus, in the accumulating period, the photo-generated charges can be accumulated in the accumulation well 4 while preventing the transfer of the charges between the modulation well 5 and the accumulation well 4. Furthermore, before reading a pixel signal, while the movement of charges between the modulation well 5 and the discharge contact region 15 is prevented, the photo-generated charges transferred from the accumulation well 4 can be held in the modulation well 5.

Thus, during the period until the reading based on the photo-generated charges that have been transferred to the modulation well 5 and held therein is completed, the amount of the held photo-generated charges can be made constant even within the accumulating period. Therefore, even in the accumulating period, the reading of a pixel signal based on the charges held in the modulation well 5 can be carried out.

Moreover, during the accumulating period, the accumulation well 4 is surrounded, in terms of potential, by the transfer transistor TT and the LOD transistor TL having a sufficiently high potential barrier, such that the accumulating operation can be carried out even in the reading period for the modulation well 5. Furthermore, even in the case in which the potential by the photo-generated charges becomes remarkably large such as the case in which extremely strong light enters, the photo-generated charges flow to the OD contact region 11 side, not to the modulation well 5 side, and do not have an adverse influence on the reading.

In addition, even if the charges in the modulation well 5 overflow, the overflow charges flow, not to the transfer channel RT side, but rather to the residual charges discharging channel RC side, thereby preventing an increase of accumulated charges due to a reverse flow of the charges.

Incidentally, in the device of Japanese Unexamined Patent Publication No. 2002-134729, potential designing is implemented so that the photo-generated charges generated in the first well region of the photo diode side are transferred to the second well region of the modulation transistor side. Therefore, as a channel for discharging charges remaining in the second well, a channel from the second well region to the substrate through the N layer on the substrate is considered. However, as described above, in order to form such a discharge channel, it is necessary to strictly control the concentration relationship of each layer such as the setting of the concentration in the carrier pocket and that in the N layer on the substrate in order to control the potential gradient adequately. Furthermore, applied potential in a broad voltage range must be used such that the versatility in design in terms of an impurity profile is remarkably damaged, which is not practical.

On the contrary, in the present embodiment, the residual charges discharging channel RC by the clear gate 14 is formed in the vicinity of the substrate 1 surface, and the residual charges in the modulation well are discharged in the lateral direction of the substrate. Therefore, the versatility in design in terms of the impurity profile is extremely high in the modulation transistor TM forming region.

Moreover, in the device of Japanese Unexamined Patent Publication No. 2002-134729, both a higher quality image and miniaturization have not been satisfactorily achieved due to the fact that the overflow drain region used as a discharge channel on the first well region side needs to be constituted with a deep P layer extending from the substrate to the substrate surface.

On the other hand, in the present embodiment, unwanted charges including the overflow charges from the accumulation well 4 are transferred in the horizontal direction, and thereafter are discharged from the OD contact region 11 through the wire on the substrate 1. In addition, the residual charges from the modulation well 5 are transferred in the horizontal direction, and thereafter are discharged from the discharge contact region 15 through the wire on the substrate 1. Therefore, it is not necessary to form a deep overflow drain region extending from the substrate 1a to the substrate 1 surface such that both a higher quality image and miniaturization can be achieved satisfactorily.

Circuit Configuration of the Entire Device

Next, the circuit configuration of the entire solid-state imaging device according to the present embodiment will be described with reference to FIG. 4.

A solid-state imaging device 61 has a sensor cell array 62 including the sensor cells 3 of FIGS. 1 through 3, and circuits 64 through 70 that drive each of the sensor cells 3 in the sensor cell array 62. The sensor cell array 62 is constituted by arranging the cells 3 in a matrix. The sensor cell array 62 includes, for example, the cells 3 of 640×480, and a region (OB region) for optical black (OB). When the OB region is included, the sensor cell array 62 is made up of the cells 3 of 712×500.

Equivalent Circuit of Sensor Cell

Figure 5A:
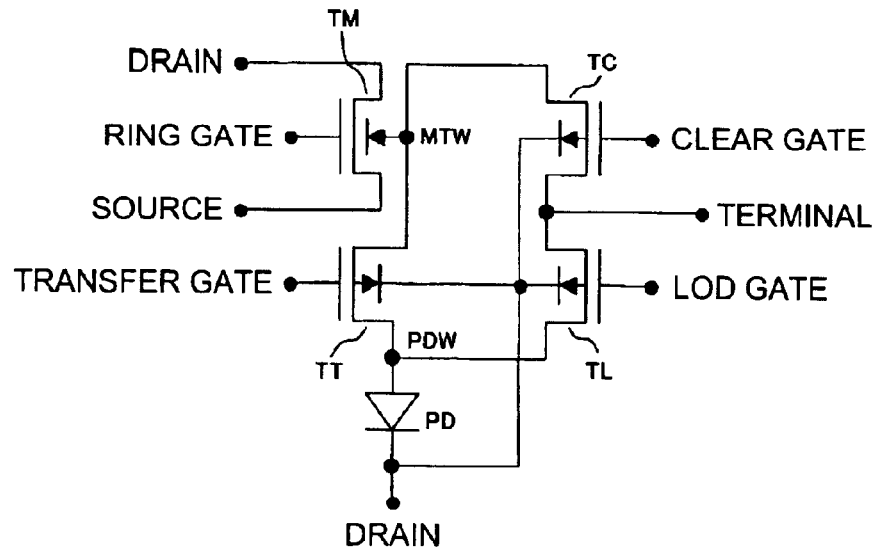
FIGS. 5A and 5B are equivalent circuit diagrams of a sensor cell.
Figure 5B:
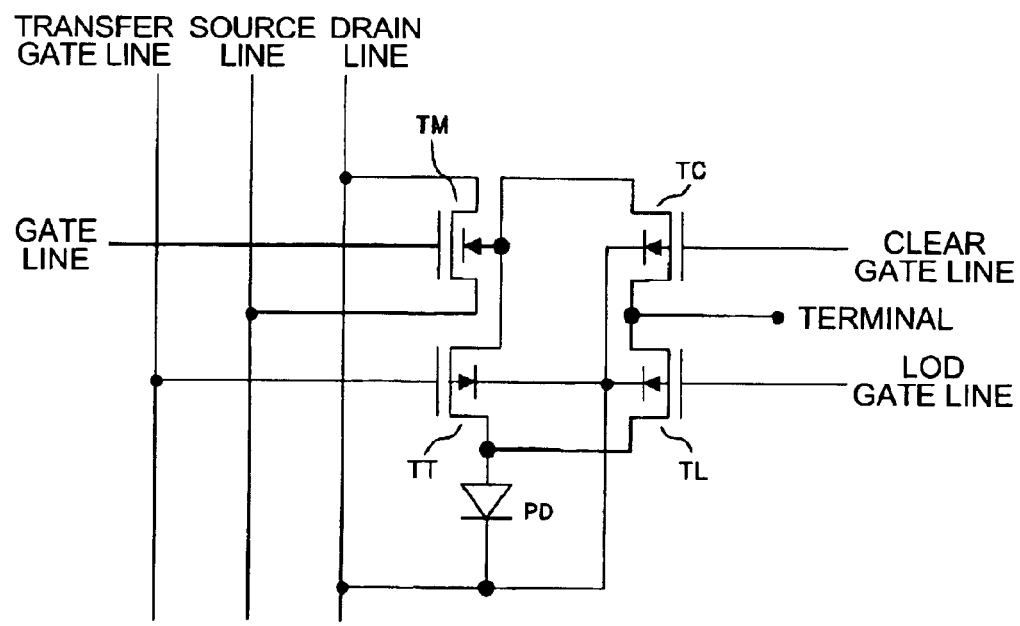

FIG. 5 shows the specific circuit configuration of each sensor cell in FIG. 4. FIG. 5A shows an equivalent circuit of the sensor cell, and FIG. 5B shows coupling between the sensor cell and each signal line.

Each of the sensor cells 3 includes the photo-diode PD that performs photoelectric conversion, the modulation transistor TM for detecting and reading an optical signal, and the transfer transistor TT that controls the transfer of photo-generated charges. The photo diode PD generates charges (photo-generated charges) corresponding to incident light, and accumulates the generated charges in the accumulation well 4 (corresponding to a coupling point PDW in FIG. 5). The transfer transistor TT transfers the photo-generated charges accumulated in the accumulation well 4 in the accumulating period to the carrier pocket 10 in the modulation well 5 (corresponding to a coupling point TMW in FIG. 5) used for modulating the threshold of the modulation transistor TM in the transfer period, and makes them be held (stored) therein.

With respect to the modulation transistor TM, that the photo-generated charges are held in the carrier pocket 10 is equivalent to that the back gate bias thereof is changed, and the threshold voltage of the channel changes corresponding to the amount of the charges in the carrier pocket 10. Accordingly, the source voltage of the modulation transistor TM becomes one corresponding to the charges in the carrier pocket 10, that is, the brightness of the light incident upon the photo diode PD.

Between the modulation well 5 and the terminal, the clear transistor TC, which is the residual charges discharging control element, is disposed. The clear transistor TC controls the potential barrier between the modulation well 5 and the terminal, and thus discharges the charges remaining in the modulation well 5 of the cell 3 to the terminal after reading of pixel signals is completed. Meanwhile, between the accumulation well 4 and the terminal, the LOD transistor TL as the unwanted charges discharging control element is disposed. The LOD transistor TL controls the potential barrier between the accumulation well 4 and the terminal so as to discharge the unwanted charges in the accumulation well 4 to the terminal.

Thus, each cell 3 exhibits the above mentioned operations of accumulation, transfer, reading, discharge, and so forth by applying a driving signal to the ring gate 6 of the modulation transistor TM, the source and drain, the transfer gate 13 of the transfer transistor TT, the clear gate 14 of the clear transistor TC, and the LOD gate 12 of the LOD transistor TL. As shown in FIG. 4, a signal is provided to each part of the cells 3 from vertical drive scanning circuits 64 through 66, a drain driving circuit 67, and a transfer driving circuit 68.

FIG. 5B shows the coupling with each of the scanning circuits 64 through 66, the driving circuits 67 and 68, and the signal output circuit 69, for one of the cells 3 arranged in a matrix. The coupling condition of other cells is the same. Each of the cells 3 is provided corresponding to the intersection between a plurality of source lines horizontally arranged and a plurality of gate lines vertically arranged with respect to the sensor cell array 62. In each cell 3 of each line arranged in the horizontal direction, the ring gate 6 of the modulation transistor TM is coupled to a common gate line, and in each cell 3 of each column arranged in the vertical direction, the source of the modulation transistor TM is coupled to a common source line.

By providing an ON signal to one of the plurality of gate lines, each cell commonly coupled to the gate line to which the ON signal is provided is simultaneously selected, and a pixel signal is output from each source of these selected cells through each source line. The vertical drive scanning circuit 64 provides ON signals to the gate lines with sequentially shifting the signals in one frame period. The pixel signals from each cell of the line to which the ON signal is provided are simultaneously read from the source lines by one line, so as to be provided to the signal output circuit 69. The pixel signals from one line are sequentially output (line-out) for every pixel from the signal output circuit 69 by the horizontal drive scanning circuit 70.

In the present embodiment, as described above, the accumulation well 4 and the modulation well 5 are formed in a manner of being isolated from each other in terms of potential, and the transfer transistor TT that controls the potential barrier between the accumulation well 4 and the modulation well 5 is provided. Thus, accumulation of the photo-generated charges by the photo diode PD and the reading of a pixel signal by the modulation transistor TM are carried out simultaneously. The control of the transfer transistor TT is carried out by providing a gate signal to the transfer gate 13 of each transfer transistor TT from the transfer driving circuit 68.

In the present embodiment, as described above, the unwanted charges discharging channel RL of the accumulation well 4 and the residual charges discharging channel RC of the modulation well 5 that are disposed adjacently to each other, are provided as channels different from each other. In addition, the LOD transistor TL and the clear transistor TC that controls the potential barriers of these two channels are provided. Thereby, the discharge of unwanted charges from the accumulation well 4 and the discharge of residual charges from the modulation well 5 can be implemented surely in terms of potential. The control of the LOD transistor TL and the clear transistor TC is carried out by providing the gate signal to each LOD gate 12 or clear gate 14 from the vertical drive scanning circuits 65 and 66, respectively. The drain driving circuit 67 provides a drain voltage to the drain of each modulation transistor TM.

Relationship between accumulating period and reading period

FIG. 6 is a timing chart for illustrating each driving period in the present embodiment. FIG. 6 shows the driving sequence in a normal mode to be described later. In FIG. 6, L1, L2, and so on correspond to each line of the sensor cell array 62.

The accumulating period is set to be within a period common to all of the cells, as described later. However, the reading is carried out for each line. The reading timing differs for each line, and the reading period (blanking period) for each line is shown as a pulse shape in FIG. 6. Hereinafter, the line in which the reading is carried out is referred to as a read line, and each cell of the read line is referred to as a read cell. Meanwhile, lines other than the read line are referred to as non-read lines, and each cell of the non-read lines is referred to as a non-read cell.

Reading Period

The reading period (blanking period) comprises an S (signal) modulation period, a clear period, and an N (noise) modulation period in the present embodiment. A signal component and a noise component are read from the same cell so as to be compared in order to remove the variation between the cells 3 and various kinds of noises. During the S modulation period, the S modulating operation for reading a pixel signal based on the photo-generated charges accumulated in the modulation well 5 is carried out. During the clear period, the clear operation for discharging the photo-generated charges remaining in the modulation well 5 through the residual charges discharging channel RC is carried out in order to read the noise component. During the N modulation period, in order to read the noise component from the modulation well 5, N modulating operation for reading a pixel signal after clearing is carried out.

Accumulating Period

In the present embodiment, the accumulating operation (parallel accumulating operation) for the accumulation well 4 is carried out even in the blanking period. Namely, the S modulation period, the clear period, and the N modulation period during the blanking period are, in terms of accumulation, a parallel accumulating period Ss at S modulation time, a parallel accumulating period Sc at clearing time, and a parallel accumulating period Sn at N modulation time, respectively.

The accumulating period according to the present embodiment includes, besides a parallel accumulating period that is the same period as the blanking period, a single accumulating period Sa in which a single accumulating operation is carried out. The pixel signal read in the blanking period is held in a line memory (corresponding to the signal output circuit 69 of FIG. 4). The pixel signals for one line are sequentially output by a pixel unit from this line memory, and the reading from each cell of the next line is carried out after the output of the line memory is completed. Therefore, the reading from the cell of the next line can not be carried out until the output from the line memory is completed. The single accumulating period Sa is set within such a period required for transferring and outputting (line-out) the pixel signal from the line memory.

Sequence in Frame

In the present embodiment, for example, as shown in FIG. 6, one frame period is constituted by cyclically repeating the single accumulating period Sa and the parallel accumulating periods Ss, Sc, and Sn after the transfer period and the PD clear period to be described later. All of the cells 3 of the sensor cell array 62 cyclically repeat the operation of the single accumulating period Sa and the parallel accumulating periods Ss, Sc, and Sn. Then, for each line, only the period shown in the pulse shape of FIG. 6 among the parallel accumulating periods Ss, Sc, and Sn is set to be the blanking period (the cell becomes the read cell), in which the reading operation is carried out. In one frame period, the single accumulating period Sa and the blanking period are repeated by the number of lines.

In the single accumulating period Sa and the parallel accumulating periods Ss, Sc, and Sn, the photo-generated charges are sequentially accumulated in the accumulation well 4, as described later. As shown in FIG. 6, the period from completion of the PD clear period to the completion of a frame period is the accumulating period, during which the photo-generated charges accumulated in the accumulation well 4 are transferred from the accumulation well 4 to the modulation well 5 in the transfer period, which is the leading period of the following frame, shown in FIG. 6, so as to be held. During the transfer period, all of the cells perform the transfer operation, as described later.

Next, the PD clear period, which is very short, is set in order to discharge the photo-generated charges generated during the period from the completion of the transfer period to the start of the accumulating period. In the PD clear period, unwanted charges are discharged from the accumulation well 4 of all of the cells. Here, the PD clear period is used for setting the length of the accumulating period, and therefore the PD clear period can be omitted in a normal mode.

In view of a given line, for example, in each cell in a line L1, during the blanking period as shown in FIG. 6, the S modulating operation, the clear operation, and the N modulating operation are carried out on the modulation transistor TM side, as the read cell. At the same time, on the accumulation well 4 side, the parallel accumulating operation Ss at S modulation time, the parallel accumulating operation Sc at clearing time, and the parallel accumulating operation Sn at N modulation time are carried out. During the period other than this blanking period, as the non-read cell, the single accumulating operation Sa, the parallel accumulating operation Ss at S modulation time, the parallel accumulating operation Sc at clearing time, and the parallel accumulating operation Sn at N modulation time are cyclically repeated.

Namely, in any cell, all of the periods except for the transfer period and the PD clear period are set as the single or parallel accumulating period, and the parallel accumulating operation is also carried out especially during the blanking period of the read cell. Then, the accumulated photo-generated charges are transferred to the modulation well 5 in the transfer period at the beginning of the next frame. Namely, the period from the completion of PD clear period (the completion of the transfer period in the case in which the PD clear period is omitted) of the previous frame to the start of the transfer period is the accumulating period for each cell, and a pixel signal used for blanking is based on the photo-generated charges accumulated in the accumulating period of the previous frame.

Potential

Next, with reference to FIGS. 7 and 8, the operation in the single accumulating period Sa, the transfer period, the S modulation period (parallel accumulating period Ss), the clear period (parallel accumulating period Sc), the N modulation period (parallel accumulating period Sn), and the PD clear period will be described based on the potential relationship. FIG. 7 is an explanatory diagram illustrating the potential relationship for each period with defining a direction along which the hole potential becomes higher as a positive side. FIG. 7A shows the condition at single accumulation time, FIG. 7B shows the condition at transfer time, FIG. 7C shows the condition at S modulation or N modulation (S/N modulation) time, FIG. 7D shows the condition at clearing time, and FIG. 7E shows the condition of the accumulation well 4 at clearing (PD clear) time in a high-speed shutter mode. The column on the left side of FIG. 7 shows the condition of the read cell, and the column on the right side shows the condition of the non-read cell. In addition, FIG. 7 shows the potential change by the charges, with a satin pattern. Moreover, as described above, whether each cell becomes either the read cell or the non-read cell is indicated by the pulse of FIG. 6.

FIG. 7 shows the potential relationship for each position by setting the position corresponding to the cut line of each cell of FIG. 2 in the horizontal axis, and setting the potential with reference to the hole in the vertical axis. From the left side to the right side in FIG. 7, the potentials in the substrate at the positions of the discharge contact region (Sub), the clear gate (CG) 14 (residual charges discharging channel portion), one end side of the carrier pocket (PKT) 10, the source (S), the other end side of the carrier pocket (PKT) 10, the transfer gate (TX) 13 (transfer channel RT portion), the accumulation well region (PD), the LOD gate (LOD) 12 (unwanted charges discharging channel RL portion) and the OD contact region (Sub) are shown.

Moreover, FIG. 8 shows changes of the driving voltage for each period. In FIG. 8, the dashed lines show changes of the driving voltage of the selected line. FIG. 8 shows the changes of the driving voltage for each period, however the actual driving sequence differs from the order of the periods to be set. FIG. 8 shows the setting of the driving voltage shown in FIG. 7 in time order (sequentially). In FIG. 8, as for the blanking period, the driving voltage of the read cell is shown with a dashed line and the driving voltage of the non-read cell is shown with a solid line.

The potential of each part changes corresponding to the driving voltage. For example, if the source voltage, the drain voltage, and so forth are increased or decreased, the potential of the surroundings increases or decreases similarly. For example, the potential of the accumulation well 4 is influenced mainly by both the applied voltages to the source and to the drain of the modulation transistor TM. Moreover, the potential of the modulation well 5 is increased or decreased mainly corresponding to the ups and downs of the gate voltage of the modulation transistor TM.

In the present embodiment, the same driving is implemented for all of the cells in the single accumulating period Sa shown in FIG. 7A. As also shown in FIG. 8, in the single accumulating period Sa shown in FIG. 7A, 0.0 V is applied to the ring gate (RG) 6, 2.5 V is applied to the transfer gate (TX) 13, 2.5 V is applied to the clear gate 14, 2.0 V is applied to the LOD gate 12, 1.0 V is applied to the drain D, and 1.0 V is applied to the source. The drain voltage is set to relatively low value.

In the single accumulating period, the potential barrier of the transfer channel RT between the accumulation well 4 and the modulation well 5 is made high sufficiently by the transfer transistor TT. Moreover, the potential barrier of the unwanted charges discharging channel RL between the accumulation well 4 and the OD contact region 11 is made high sufficiently by the LOD transistor TL. Furthermore, the potential of the potential barrier of the transfer channel RT is made higher than the potential of the potential barrier of the unwanted charges discharging channel RL. The concentration in the accumulation well 4 is set relatively high, and its potential before the accumulation of the charges is relatively low. When the accumulation is started, the charges are generated by light entering from the opening region 2 of the photo diode PD so as to be accumulated in the accumulation well 4. FIG. 7A shows the potential increase by the accumulation of the charges, with a satin pattern.

In the present embodiment, the potential barriers of the unwanted charges discharging channel RL and the transfer channel RT are so high (potential is high) that the charges generated by incident light are not transferred to the modulation well 5 but accumulated in the accumulation well 4. Since the potential barrier of the transfer channel RT is higher than the potential barrier of the unwanted charges discharging channel RL, even if extremely strong light enters the charges that overflow from the accumulation well 4 are discharged to the OD contact region 11 through the unwanted charges discharging channel RL, without flowing into the modulation well 5.

In the transfer period shown in FIG. 7B, 0.0 V is applied to the ring gate (RG) 6, 0.0 V is applied to the transfer gate (TX) 13, 2.5 V is applied to the clear gate 14, 2.0 V is applied to the LOD gate 12, 4.0 V is applied to the drain D, and 0.0 V is applied to the source.

Since 0 V is applied to the ring transfer gate 13, the potential barrier of the transfer channel RT becomes low enough. Thus, the charges accumulated in the accumulation well 4 in the above single accumulating period Sa and the parallel accumulating periods Sa, Sc, and Sn to be described later, flow into the modulation well 5 through the transfer channel RT. By setting the drain voltage to a relatively high voltage, the potential gradient is increased so as to facilitate the transfer of the charges.

Meanwhile, the potential barrier of the discharge channel by the clear gate 14 is set to be high enough such that the charges held in the modulation well 5 do not flow into the discharge channel side. Moreover, also in the transfer period shown in FIG. 7B, all of the cells become the read cells, and the same driving is carried out.

The reading period includes the signal modulation (S modulation) period for mainly reading the signal component (S), the noise modulation (N modulation) period for mainly reading the noise component (N), and the clear period for clearing the residual charges in order to read the noise component. The image signal from which the cell variation and the various kinds of noises are removed is obtained by reading and comparing the signal component and the noise component. Namely, in the reading period, the S modulation period, the clear period, and the N modulation period are carried out in this order.

The same control is carried out in the S modulation period and in the N modulation period. In the S/N modulation period shown in FIG. 7C, with respect to the read cell, as shown in the dashed line of FIG. 8, 2.5 V is applied to the ring gate (RG) 6, 2.5 V is applied to the transfer gate (TX) 13, 2.5 V is applied to the clear gate 14, 2.0 V is applied to the LOD gate 12, and 2.5 V is applied to the drain D. Vg−Vths (=2.5−Vths) arises in the source (Vg is the gate voltage and Vths is the threshold voltage of the channel at S modulation time).

The reading is carried out for each line. Only each cell of one line (read line) out of all lines becomes a read cell, and each cell of other lines (non-read lines) is a non-read cell. Then, upon completion of reading of each read cell from the read line, the read line shifts, and each cell of the next line becomes a read cell, and other cells become the non-read cells. Similarly, the reading (S modulation) of the signal component or the reading (N modulation) of the noise component is carried out while shifting the read lines.

As for the read cell, the potential barrier of the transfer channel RT by the transfer transistor TT is made high so that the charges held in the modulation well 5 may not flow into the accumulation well 4. Since the voltage of the ring gate 6 is made high, the source potential increases accordingly. The threshold voltage of the channel of the modulation transistor TM changes according to the charges held in the carrier pocket 10. Namely, the photo-generated charges accumulated in the accumulation well 4 of the photo diode PD are transferred to the carrier pocket 10, and thereby the source potential of the modulation transistor TM becomes one corresponding to the generation amount of the photo-generated charges, that is, incident light.

Meanwhile, as for the non-read cell, as shown in the solid line of FIG. 8, 0.0 V is applied to the ring gate (RG) 6, 2.5 V is applied to the transfer gate (TX) 13, 2.5 V is applied to the clear gate 14, 2.0 V is applied to the LOD gate 12, 2.5 V is applied to the drain D. Also in this case, Vg−Vths (=0−Vths) arises in the source, however, since the voltage of the ring gate 6 is low, the level of output of the non-read cell becomes sufficiently lower than that of output of the read cell. Therefore, only an output pixel signal of the read cell appears in the source line.

Since the difference in potential applied to the ring gate 6 is made large enough between the read cell and the non-read cell, even if, for example, an image is dark or the like, the output pixel signal of the read cell can be taken out from the source line securely.

In the clear period shown in FIG. 7D, with respect to the read cell, as shown in the dashed line of FIG. 8, 1.5 V is applied to the ring gate (RG) 6, 2.5 V is applied to the transfer gate (TX) 13, 0.0 V is applied to the clear gate 14, 2.0 V is applied to the LOD gate 12, 2.5 V is applied to the drain D, and 5.0 V is applied to the source.

Thus, the potential barrier of the discharge channel is lowered sufficiently by the clear gate 14 so as to flow the charges remaining in the modulation well 5 from the discharge channel into the discharge contact region 15. Accordingly, the photo-generated charges in the modulation well 5 are removed, enabling the reading (noise modulation) of the noise component.

Meanwhile, as for the non-read cell, as shown in the solid line of FIG. 8, 1.5 V is applied to the ring gate (RG) 6, 2.5 V is applied to the transfer gate (TX) 13, 2.5 V is applied to the clear gate 14, 2.0 V is applied to the LOD gate 12, 2.5 V is applied to the drain D, and 5.0 V is applied to the source. Thus, the potential barrier of the residual charges discharging channel by the clear gate 14 still remains high.

The reading of the non-read cell for which the blanking period in FIG. 6 has passed, out of the cells of each line, has already been completed, however, as for the non-read cells of lines before the blanking period passes, the reading has not been carried out yet. Thus, as for the non-read cells, the potential barrier of the discharge channel by the clear gate 14 is kept high so as to prevent the charges from being discharged from the modulation well 5. The satin-pattern portion with respect to the non-read cell of FIGS. 7C and 7D indicates that the charges that have not been read are held in the modulation well 5.

In the present embodiment, as described above, the parallel accumulating operation is carried out in the S/N modulation period and the clear period. FIGS. 7C and 7D show this parallel accumulating operation. Namely, in the reading period (S/N modulation and clear period), the photogenerated charges are accumulated in the accumulation well 4 by raising the potential barriers of the transfer channel RT and the unwanted charges discharging channel RL. Thus, the reading period (modulation and clear period) of the modulation transistor TM corresponds to the accumulating period (parallel accumulating periods Ss, Sn, and Sc) for accumulating the photo-generated charges on the photo diode PD side. In the parallel accumulating periods Ss and Sn of FIG. 7C, and the parallel accumulating period Sc of FIG. 7D, the drain voltage is higher as compared with the single accumulating period Sa, and thus the conditions of accumulating the photo-generated charges differ. Moreover, as shown in FIGS. 7C and 7D, the conditions of accumulating the photo-generated charges differ slightly between the read cell and the non-read cell.

Thus, in the single accumulating period Sa, the S/N modulation period, and the clear period, accumulation of the photo-generated charges are carried out in all of the cells, and the accumulation time for each cell is approximately one frame period as shown in FIG. 6. The accumulation well 4 for accumulating charges that is formed on the photo diode PD side, and the modulation well 5 formed on the modulation transistor TM side are separately constituted, and the potential barrier of the transfer channel RT between both is controlled by the transfer transistor TT in this way. Accordingly, the accumulation well 4 and the modulation well 5 can be set in the reading period and the parallel accumulating period during the same period, and thereby the frame rate can be enhanced.

The PD clear period, which is an initialization period, shown in FIG. 7E is adopted in a high-speed shutter mode or in a low-speed shutter mode to be described later. As shown in FIG. 8, 0.0 V is applied to the ring gate (RG) 6, 2.5 V is applied to the transfer gate (TX) 13, 2.5 V is applied to the clear gate 14, 2.0 V is applied to the LOD gate 12, 4.0 V is applied to the drain D, and the source is set to be high impedance. The driving voltage when PD clear period is used in a normal mode is also the same as that of FIG. 7E.

The potential barrier of the unwanted charges discharging channel RL is lowered sufficiently by lowering the voltage appied to the LOD gate, so as to discharge the unwanted charges accumulated in the accumulation well 4 are discharged from the unwanted charges discharging channel RL to an external signal line through the OD contact region 11. In the case in which PD clear operation is adopted in a normal mode as shown in FIG. 6, the residual charges are not left in the modulation well 5 portion of FIG. 7E.

Driving Sequence

Next, the operation sequence regarding each mode of the normal mode, the high-speed shutter mode and the low-speed shutter mode will be described.

FIGS. 9 and 10 are timing charts showing the driving sequences. FIG. 9 shows the normal mode, FIG. 10A shows the high-speed shutter mode, and FIG. 10B shows the low-speed shutter mode.

In the normal mode of FIG. 9, the same operation as that of FIG. 6 described above is carried out. The PD clear period is omitted in the normal mode of FIG. 9. Moreover, in FIGS. 9 and 10, the single accumulating period Sa (line-out period) and the blanking period of FIG. 6 are combined so as to be shown as one pulse shape. As described above, the single accumulating period Sa is the time required for transferring data from the line memory, and actually needs time longer than the blanking period.

In the normal mode of FIG. 9, a period obtained by removing the transfer period from one frame period is the accumulating period in each cell, and the reading from all cells is completed in one frame period. Since the parallel accumulating period is set using a time common to the blanking period, it is not necessary to prepare another period for accumulation, and thus the frame rate can be enhanced.

FIG. 10A shows the driving sequence in the high-speed shutter mode.

The high-speed shutter mode is used, for example, for shortening the accumulating period. In the conventional examples, since the residual charges in the first well are discharged after completion of the blanking, the high-speed shutter mode and so forth in the present embodiment can not be implemented.

For example, when extremely bright light enters the photo diode PD, the amount of the charges that flow into the modulation well 5 of each cell increases extremely, and therefore an image based on a pixel signal read from each cell becomes whitish (bright or washed-out) as a whole such that the contrast thereof degrades. In such a case, a high-speed shutter mode is adopted. In the high-speed shutter mode, as shown in FIG. 10A, the PD clear period is set at an arbitrary position in one frame period. As described above, the accumulating period is a period from the completion of the PD clear in the previous frame to the start time of the transfer period.

As shown in FIG. 7E, in the PD clear period, the charges accumulated in the accumulation well 4 are discharged to the outside through the OD contact region 11. Thus, the photogenerated charges generated after the completion of PD clear period are accumulated in the accumulation well 4. After the completion of the PD clear period, the single accumulating period Sa and the parallel accumulating periods Ss, Sc, and Sn are cyclically repeated until the completion of the frame period. Thus, after the accumulation is carried out only for the time shorter than the one frame period that corresponds to the position of the PD clear period, the photo-generated charges accumulated in the accumulation well 4 are transferred to the modulation well 5 in the transfer period at the beginning of the frame.

The reading in the high-speed shutter mode is the same as that in the normal mode. The reading of all lines is completed in one frame period, while the read lines are sequentially shifted. As for the cell for which the reading has not been completed, as shown in FIG. 7E, the charges are held in the modulation well 5, and can be read in one frame period regardless of the accumulating period based on the position of the PD clear period.

For example, in the case in which the PD clear period is set at approximate center of one frame period, the accumulating period becomes about a half of one frame period, and the amount of the charges that flow into the modulation well 5 becomes about a half of that in the normal mode. Therefore, the brightness of an image based on a pixel signal read from each cell can be made adequate. Thereby, an image having sufficient contrast, though it is bright, can be obtained.

Since the PD clear period can easily be set by applying the driving voltage shown in FIG. 8 to each part, the PD clear period can be arranged at an arbitrary position corresponding to the brightness of an image. Therefore, the accumulating period can be set without restraint, and a pixel signal having an optimal level corresponding to the brightness of an image can be obtained from each cell.

FIG. 10B shows the driving sequence of the low-speed shutter mode.

The low-speed shutter mode is used, for example, for making the accumulating period longer than one frame period. For example, in the case in which light incident upon the photo diode PD is dark, the amount of the charges that flow into the modulation well 5 of each cell decreases, and therefore an image based on a pixel signal read from each cell becomes dark as a whole. In such a case, the low-speed shutter mode is adopted. In the low-speed shutter mode, while the PD clear period is set once per a plurality of frame periods, the transfer period is set once per a plurality of frame periods.

In an example of FIG. 10B, the PD clear period is set once per two frame periods, and the transfer period is set at the leading timing of the frame, which is after one and a half frame periods from the completion of this PD clear period. Therefore, the accumulating period in this case becomes one and a half frame periods. Thereby, an image having approximately one and a half times brightness as compared with the normal mode can be obtained. In the case of FIG. 10B, the reading from each cell is carried out only once per two frame periods, and therefore the frame rate becomes half of that in the normal mode.

By adopting the shutter modes of FIGS. 10A and 10B, the accumulating period can be set without restraint such that an optimal image corresponding to the brightness of incident light can be obtained.

Also in the low-speed shutter mode, the reading is carried out within approximately one frame period after the transfer period. Conventionally, since the accumulated photo-generated charges are also discharged by reading, a dummy-reading involving the clear operation that does not contribute to an image signal, can not be carried out in the next one frame period after reading. On the other hand, in the present embodiment, since the reading operation can be carried out simultaneously with the accumulation of photo-generated charges, the dummy-reading involving the clear operation can be carried out even in the next one frame period after reading. Accordingly, there is an advantage that the arrangement of the logic circuit and so forth for performing the reading can be facilitated.

Process

Next, a method of manufacturing an element will be described with reference to process diagrams of FIGS. 11 through 13. Moreover, FIGS. 11 through 13 show a section at the position of the A–A' cut line of FIG. 2. In FIGS. 11 through 13, arrowheads above the substrate indicate that ions are implanted, black circles indicate an implanted material, and frames indicate a mask. In the drawings, LOD Pr, CLr Tr, R.G Tr, and Tx Tr indicate the LOD transistor TL forming region, the clear transistor TC forming region, the modulation transistor TM forming region, and the transfer transistor TT forming region, respectively.

Figure 11A:
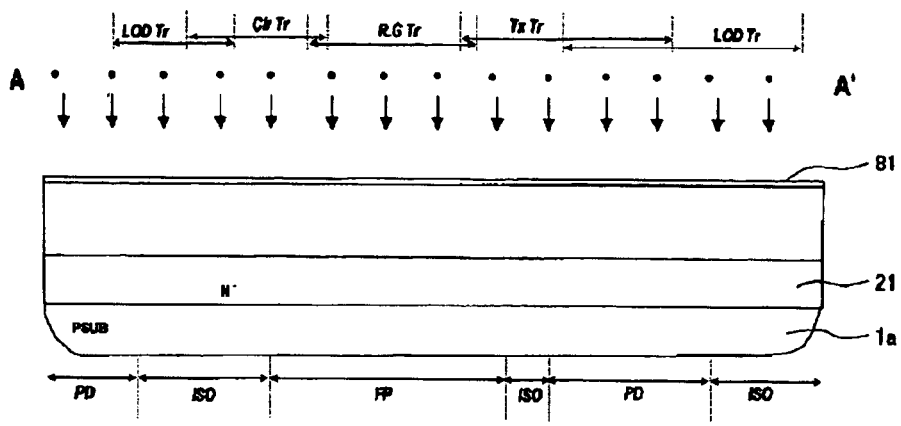
FIGS. 11A through 11C are process diagrams for illustrating a method of manufacturing an element.

As shown in FIG. 11A, a sacrificial oxide film 81 of 20 nm thickness is formed on the surface of a prepared P substrate 1. Next, phosphors (P) ions are implanted at acceleration energy of 2 MeV and dose amount of $(4-5) \times 10^{12}/cm^2$. Hereinafter, such ion implantation is described as (P, 2 MeV, 4e12, if ions are P ions, acceleration energy is 2 MeV, and dose amount is $4 \times 10^{12}/cm^2$). Furthermore, ion implantation of (P, (1–1.5) MeV, (1.5–1.8)e12) is implemented. Thus, as shown in FIG. 11A, an N-type well 21 of N⁻ is formed at a relatively deep position. Here, such successive ion implantation is shown as (material, acceleration energy, dose amount/material, acceleration energy, dose amount).

Figure 11B:
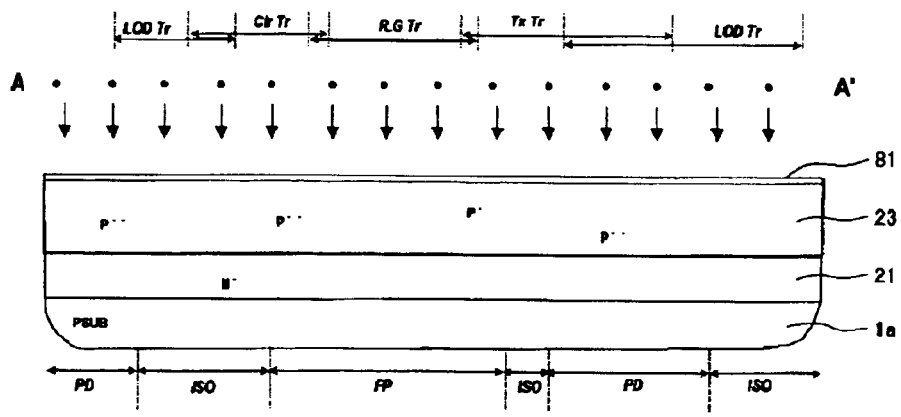

Next, as shown in FIG. 11B, the P⁻⁻ layer 23 is formed on the N-type well 21 across the entire element. For example, by implementing ion implantation of (boron (B), 200 keV, 6e11/B, 120 keV, 5e11), the P⁻⁻ layer 23 is formed on the entire surface on the substrate.

Figure 11C:
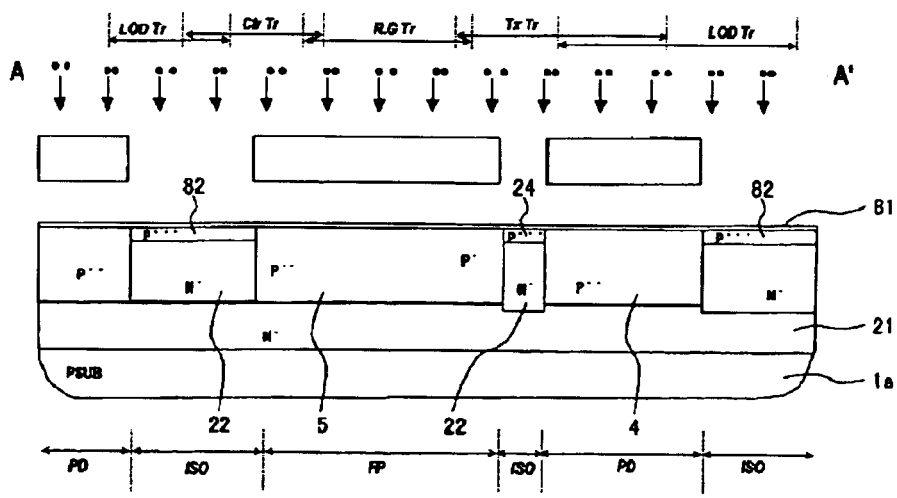

Next, as shown in FIG. 11C, the isolation regions 22 (N⁻ layer) for isolating elements are formed so as to divide the P⁻⁻ layer 23 into the accumulation well 4 and the modulation well 5. Namely, the isolation regions 22 are formed in all regions between the accumulation well 4 and the modulation well 5 of one cell and adjacent cells. The isolation regions 22 are formed by implementing ion implantation of, for example, (P, 400 keV, 6e12/P, 150 keV, 3e11) with a resist.

Moreover, on the formed isolation regions 22, the P⁻⁻ layers 24 and 82 that become channel dopes of the modulation transistor TM, the LOD transistor TL, and the clear transistor TC are formed. These channel dopes are formed by ion implantation of (B, 10 keV, 5e12), and formed on the entire region of surface of the isolation regions 22 at this time.

Figure 12A:
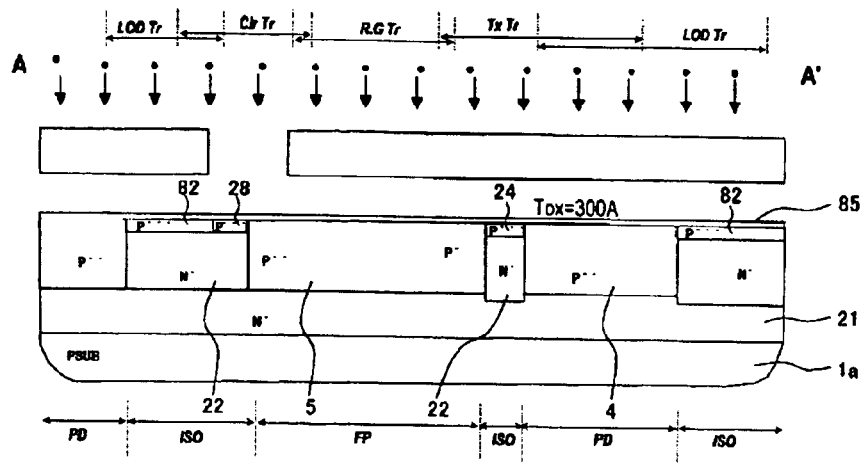
FIGS. 12A through 12C are process diagrams for illustrating the method of manufacturing an element.

Next, after the sacrificial oxide film 81 on the substrate surface is removed, a gate oxide film 85 of thickness of about 30 nm is formed on the substrate surface by thermal oxidization as shown in FIG. 12A. Then, boron is additively implanted as the channel dope of the clear transistor TC. This channel dope (P⁻⁻⁻ diffusion layer 28) is formed by ion implantation of (B, 10 keV, 3e12). Thus, the threshold voltage Vth of the clear transistor TC is lowered than Vth of other transistors. Namely, the potential under the clear gate 14 is relatively lowered so as to facilitate the discharge of the residual charges in the modulation well 5. Especially, the threshold voltage Vth of channel of the clear transistor TC needs to be lowered sufficiently since the potential of the modulation well 5 is originally low.

Figure 12B:
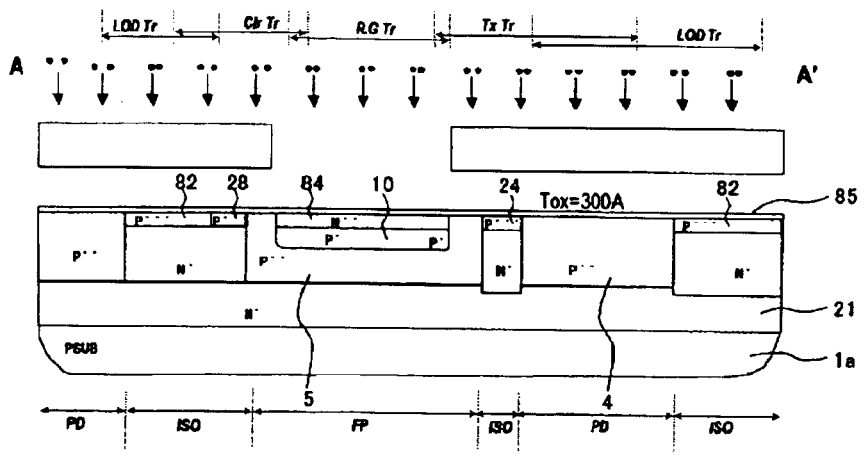

Next, as shown in FIG. 12B, the carrier pocket 10 by a P⁻ diffusion layer with high concentration is formed in the P⁻⁻ layer 23 (modulation well 5) under the ring gate 6. This carrier pocket 10 is formed by, for example, ion implantation of (B, 30 keV, 7e12). Moreover, an N⁻⁻ layer 84 for obtaining the channel of the modulation transistor TM is formed in the vicinity of substrate surface on the carrier pocket 10. This N⁻⁻ layer 84 is formed by, for example, ion implantation of (arsenic (As), 90 keV, 4e11).

Figure 12C:
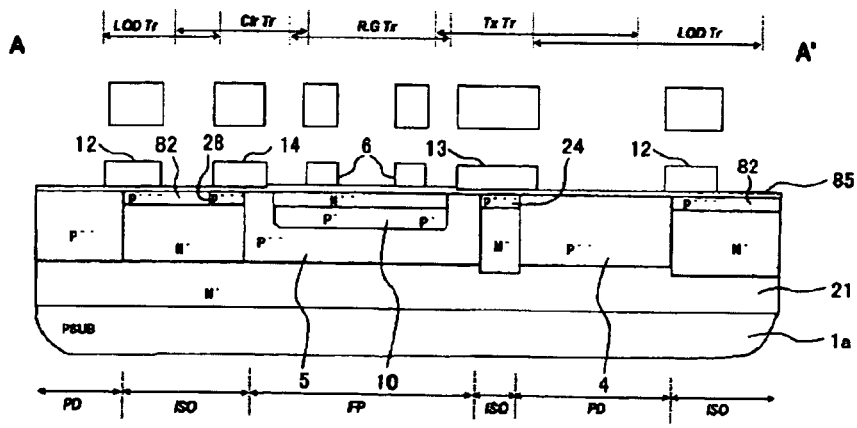

Next, as shown in FIG. 12C, the ring gate 6, the transfer gate 13, the LOD gate 12, and the clear gate 14 are formed in the modulation transistor TM forming region, the transfer transistor TT forming region, the LOD transistor TL forming region, and the clear transistor TC forming region on the gate oxide film 85, respectively.

Figure 13A:
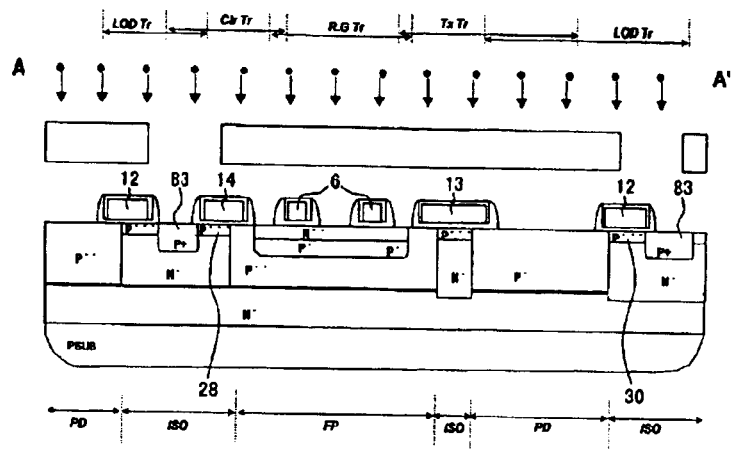
FIGS. 13A through 13C are process diagrams for illustrating the method of manufacturing an element.

Then, as shown in FIG. 13A, an oxide film is formed on the ring gate 6, the LOD gate 12, and the clear gate 14, and thereafter a P⁺⁺ layer 83 with high concentration is formed at the position adjacent to the clear gate 14 on the substrate surface in order to form the discharge contact region 15 and the OD contact region 11 that are coupled to the channel region of the clear transistor TC. In the present embodiment, the discharge contact region 15 is also used as the OD contact region 11. The diffusion layer 28 as the channel of the clear transistor TC is constituted on one side of the $P^{++}$ layer 83, while the diffusion layer 30 as the channel of the LOD transistor TL is constituted on the other side thereof. The discharge contact region 15 and the OD contact region 11 may be formed separately.

This $P^{++}$ layer 83 is formed by, for example, ion implantation of (B, 30 keV, 1e13). Then, in a manner of covering the oxide film on the ring gate 6, the LOD gate 12, and the clear gate 14, a side wall is formed for each gate.

Figure 13B:
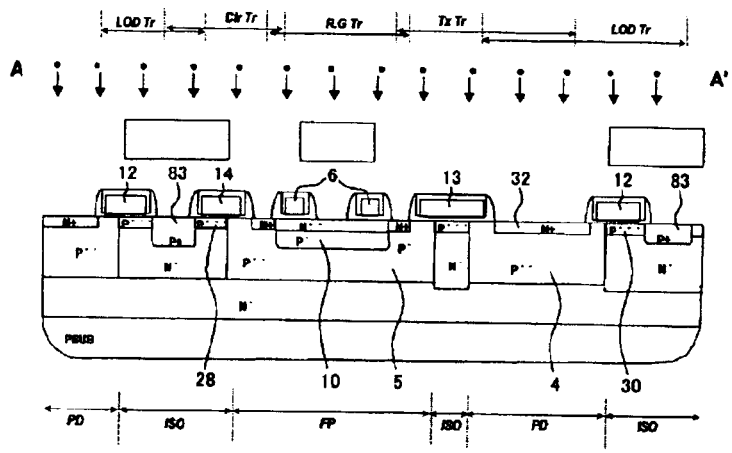

Next, as shown in FIG. 13B, the $N^+$ layers 32 are formed with a resist, in the substrate surface in the photo diode PD forming region, the substrate surface between the ring gate 6 and the transfer gate 13, and the substrate surface between the ring gate 6 and the clear gate 14. The $N^+$ layers 32 are formed by implementing ion implantation of (As, 80 keV, 1e13) for the $P^{---}$ layer in the substrate surface.

Figure 13C:
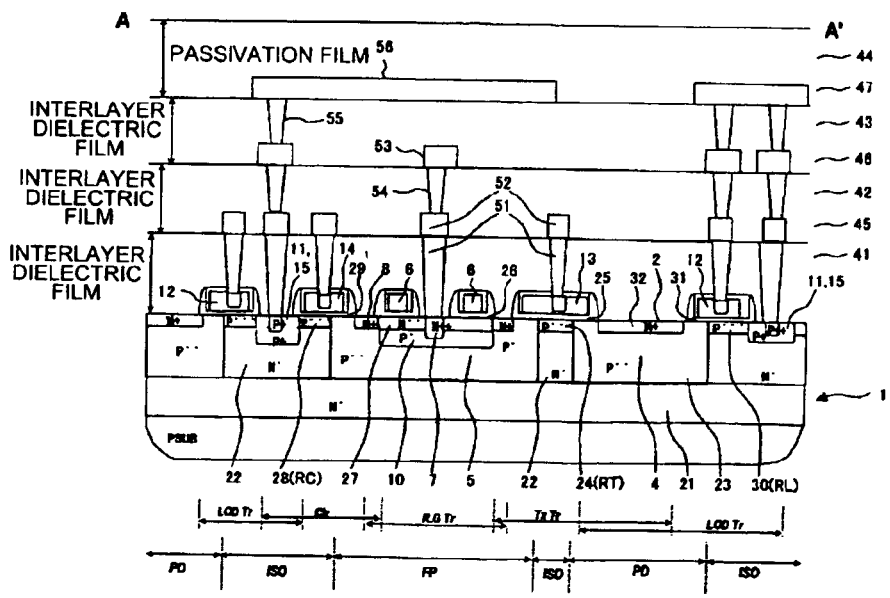

Then, as shown in FIG. 13C, after the interlayer dielectric film 41 is formed on the substrate surface, the contact holes 51 are opened at the positions in the interlayer dielectric film 41, above the LOD gate 12, the discharge and OD contact regions 15 and 11, the source region, the transfer gate 13, and the drain region 8 (not shown). Subsequently, impurities for forming $N^{++}$ regions are implanted into the LOD gate 12, the source region, the transfer gate 13, and the drain region 8 through the opened contact holes 51, so as to form each gate contact, the source region 7, and the drain contact region 9. Next, impurities for forming $P^{++}$ regions are implanted into the discharge and OD contact forming regions through the opened contact holes 51 so as to form the discharge and OD contact regions 15 and 11.

Then, each contact hole 51 is filled with, for example, aluminum, which is a wiring material, and thereby each wire 52 of the lower wiring layer 45 is coupled to the LOD gate 12, the discharge and OD contact regions 15 and 11, the source region 7, the transfer gate 13, and the drain contact region 9.

Moreover, the upper wiring layer 46 is formed above the lower wiring layer 45 including the wire 52 with the interlayer dielectric film 43 therebetween so as to be coupled to each wire 52 of the lower wiring layer 45 through the contact holes 54. In addition, the light shielding film 56 is formed above the upper wiring layer 46 with the interlayer dielectric film 43 therebetween so as to be coupled to part of the upper wiring layer 46. Finally, the passivation film 44 is formed on the light shielding layer 47.

In the present embodiment, the discharge and OD contact regions 15 and 11 are coupled to the light shielding film 56 via the contact holes 51 opened in the interlayer dielectric film 41 and the contact hole 54 opened in the interlayer dielectric film 42. A light shielding film is an essential element for an image sensor, and utilizing this essential element allows the discharge of residual charges and unwanted charges to be facilitated.

Advantageous Effect of the Embodiment

Thus, in the present embodiment, the accumulation well 4 for accumulating the photo-generated charges is formed in the photoelectric conversion element forming region, and the modulation well 5 that is potentially isolated from the accumulation well 4 is formed in the modulation transistor TM forming region. Then, by providing the transfer transistor TT for controlling the potential barrier between the accumulation well 4 and the modulation well 5, and allowing the accumulating period and the blanking period to be carried out at the same time, the enhancement of the frame rate is achieved.

In this case, the potentials of the residual charges discharging channel RC and the unwanted charges discharging channel RL are set lower than the potential of the transfer channel RT. Accordingly, in the periods other than the transfer period, the charges are not transferred between the modulation well 5 and the accumulation well 4. Even when strong light enters or the like, the photo-generated charges that overflow from the accumulation well 4 are allowed to flow to the OD contact region side 11, not to the modulation well 5 side. In addition, overflow charges of the modulation well 5 can also be flowed toward the discharge contact region 15 side, not toward the accumulation well 4 side such that the operation of reading and accumulation can be implemented surely.

Moreover, in the present embodiment, residual charges from the modulation well 5 are transferred in the lateral direction, and thereafter are discharged from the discharge contact region 15 through an external wire. Therefore, the versatility in design in terms of impurity profile in the modulation transistor forming region can be enhanced.

Moreover the residual charges from the accumulation well 5 and the unwanted charges including the charges that overflow from the accumulation well 4 are discharged through an external signal line coupled to the contact regions 15 and 11, and thus it is not necessary to form a deep overflow drain region extending from a substrate to the substrate surface. Accordingly, both a higher quality image and miniaturization can be achieved satisfactorily.

Figure 14:
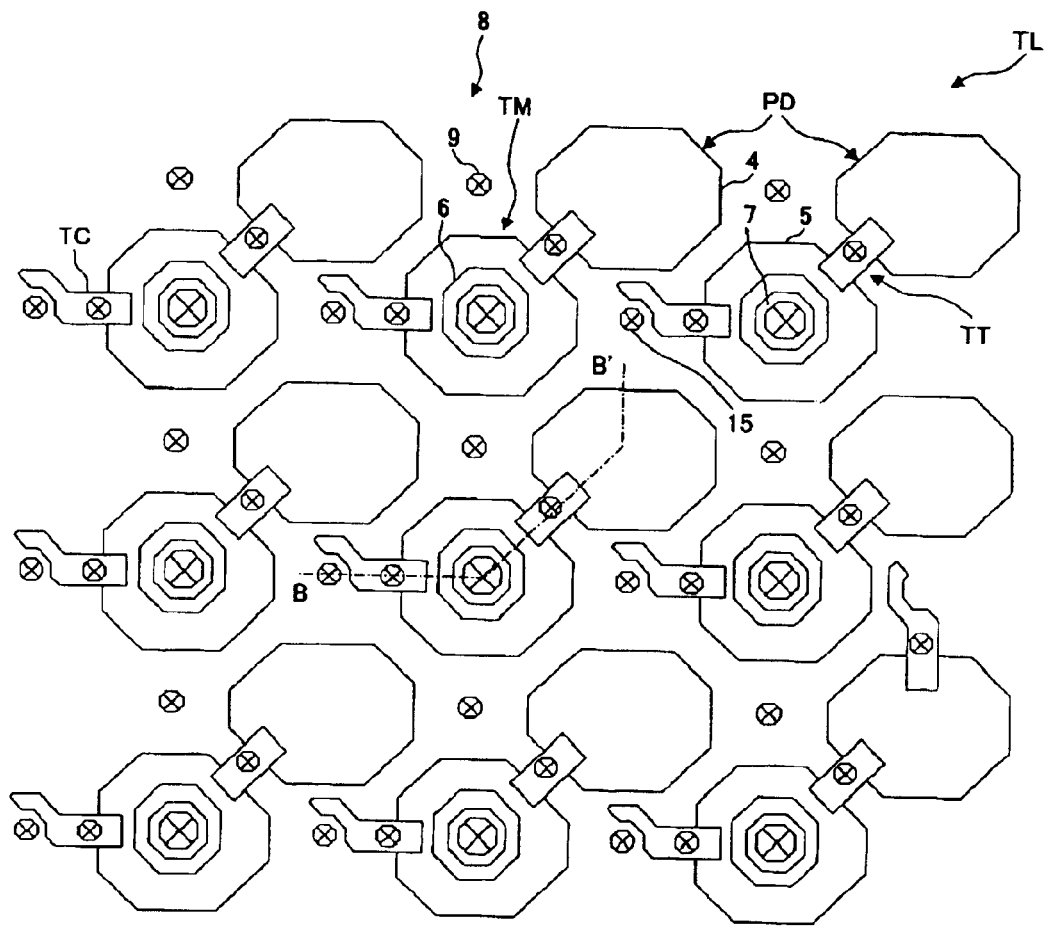
FIG. 14 is a plan view showing the planar shape of a solid-state imaging device according to a second embodiment.
Figure 15:
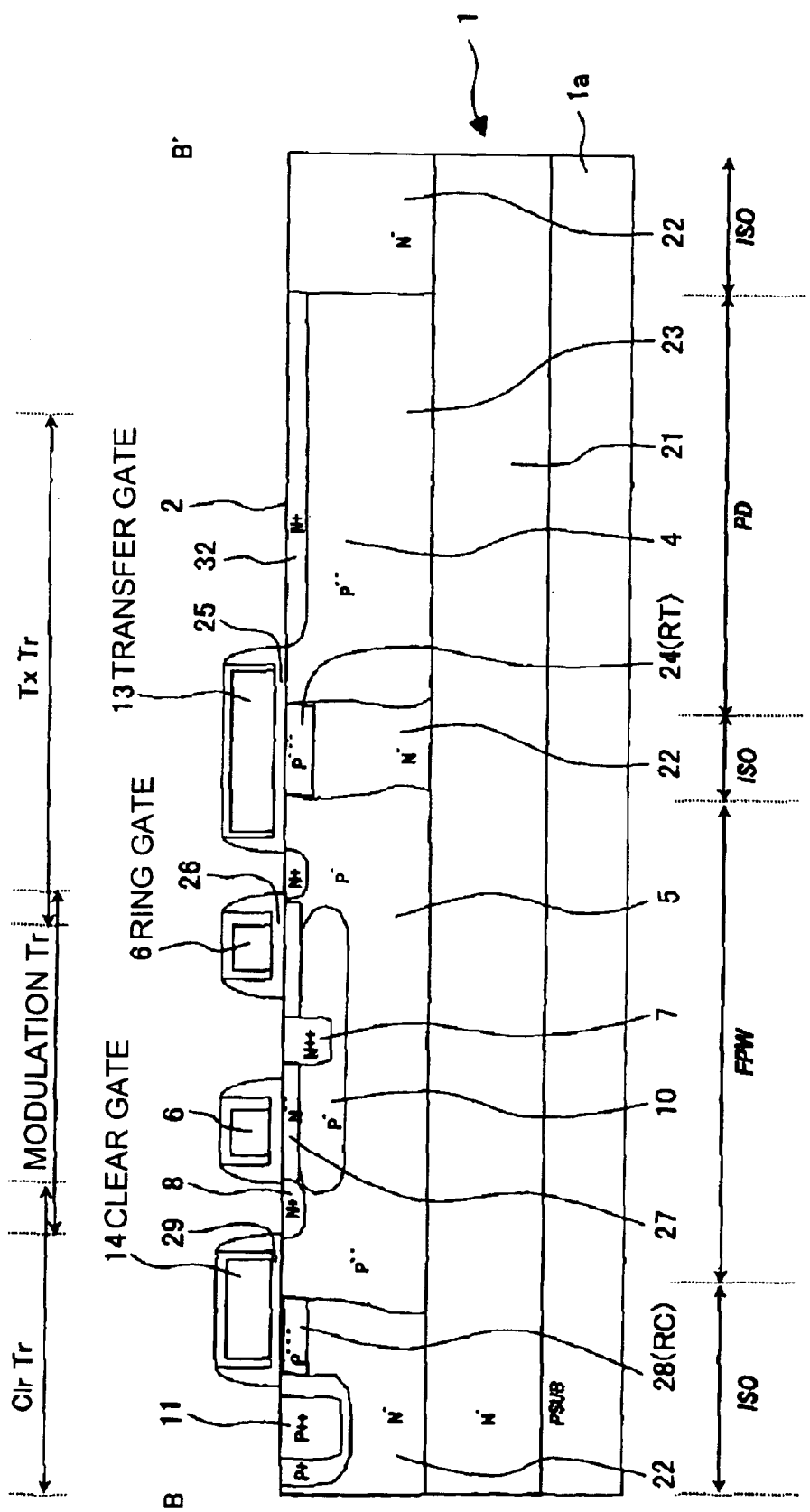
FIG. 15 is a sectional view showing the section cut along the B–B' line of FIG. 14.
Figure 16:
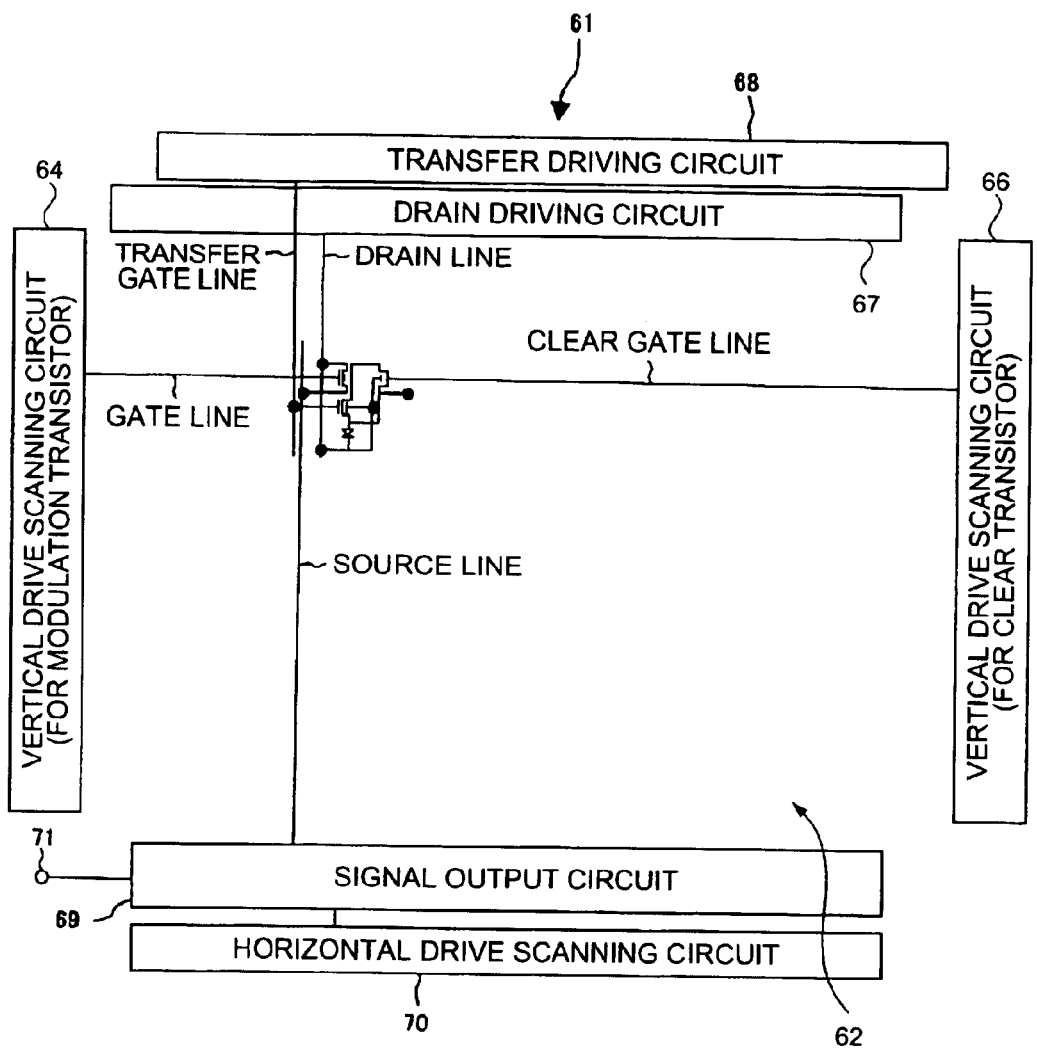
FIG. 16 is a block diagram showing the entire structure of the element of the second embodiment.
Figure 17A:
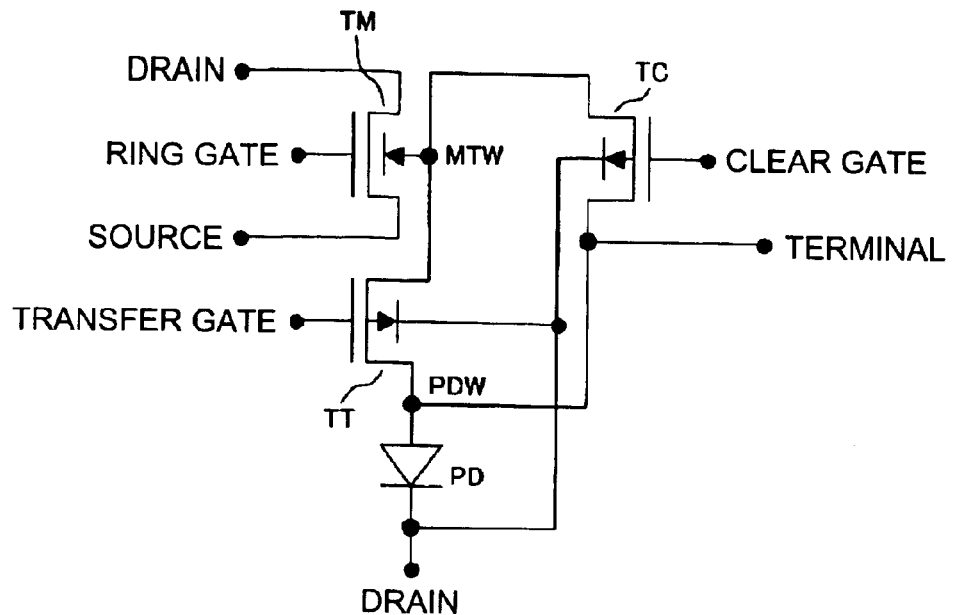
FIGS. 17A and 17B are equivalent circuit diagrams of the sensor cell of the second embodiment.
Figure 17B:
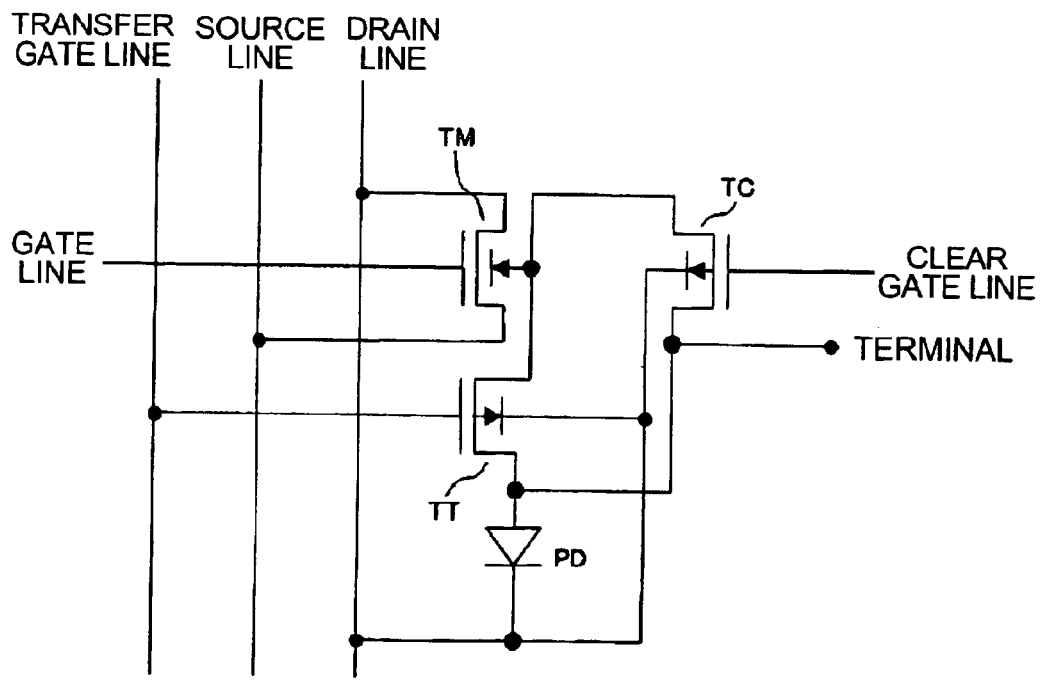
Figure 19:
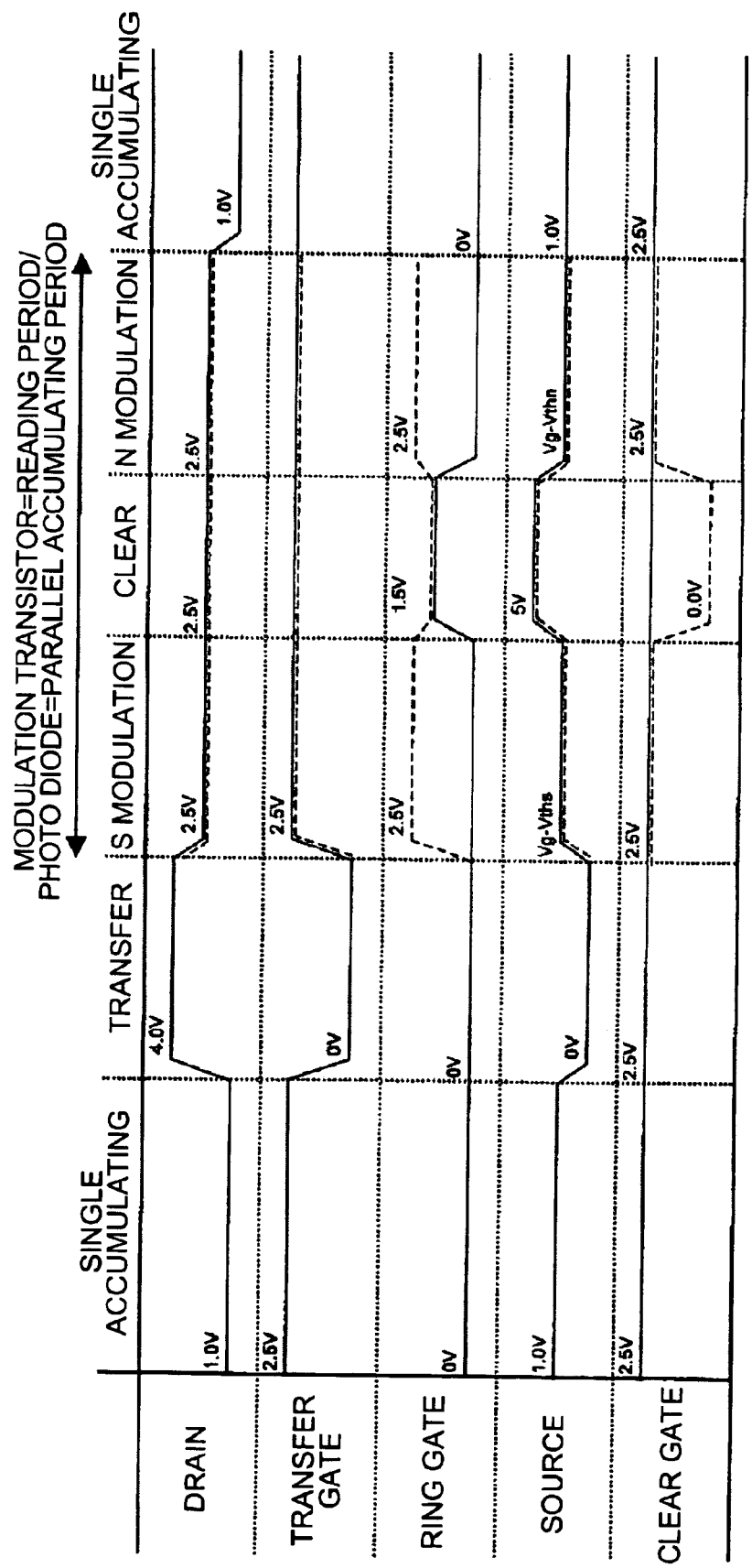
FIG. 19 is a diagram showing changes of the driving voltage in each period in the driving sequence of the second embodiment.

FIGS. 14 through 20 are related to a second embodiment of the present invention. FIG. 14 is a plan view showing a planar shape of a solid-state imaging device of the present embodiment. FIG. 15 is a sectional view showing a section cut along the B–B' line of FIG. 14. FIG. 16 is a block diagram showing the entire structure of the element. FIG. 17 is an equivalent circuit diagram of a sensor cell. FIG. 18 is an explanatory diagram showing the potential relationship for each period. FIG. 19 is an explanatory diagram showing changes of the driving voltage for each period in the driving sequence. FIG. 20 is a timing chart showing the driving sequence. In FIGS. 14 through 20, the same reference numerals are given to the same elements as those of FIG. 1, FIGS. 3 through 5, and FIGS. 7 through 10, and the description thereof will be omitted.

In the present embodiment, the only difference from the first embodiment is that the LOD transistor TL, the OD contact region 11, and the unwanted charges discharging channel RL are omitted. Namely, as shown in FIGS. 14 and 15, the unwanted charges discharging channel RL coupled to the accumulation well 4 of the photo diode PD is not formed, and the LOD transistor TL and the OD contact region 11 are also not formed. The discharge contact region 15 is formed. Other structure is the same as those of FIGS. 1 through 3.

Even when the sensor cell constituted in this way is used, the accumulating period and the blanking period can be carried out in the same period like the first embodiment.

Namely, also in the present embodiment, the transfer of charges between the modulation well 5 and the accumulation well 4 in the accumulating period can be prevented by controlling the transfer channel RT with the transfer transistor TT, and thus the photo-generated charges can be accumulated in the accumulation well 4. Furthermore, before reading of a pixel signal, while the movement of charges between the modulation well 5 and the discharge contact region 15 is prevented, the photo-generated charges transferred from the accumulation well 4 can be held in the modulation well 5.

In the present embodiment, since the PD clear by the LOD transistor TL can not be carried out, the accumulating period of the accumulation well 4 is determined by the transfer period in which the potential barrier of the transfer channel RT is lowered by the transfer transistor TT. Namely, the period from the completion of the transfer period to the start of the next transfer period is the accumulating period.

In addition, also in the present embodiment, the residual charges discharging channel RC by the clear gate 14 is formed in the vicinity of the substrate surface, and the residual charges in the modulation well are discharged in the lateral direction. Therefore, the versatility in design in terms of impurity profile in the modulation transistor TM forming region is extremely high. Then, the residual charges from the modulation well 5 are transferred in the horizontal direction, and thereafter are discharged from the discharge contact region 15 through wire on the substrate. Therefore, it is not necessary to form a deep overflow drain region extending from the substrate to the substrate surface such that both higher quality image and miniaturization can be achieved satisfactorily.

Next, the circuit configuration of the entire solid-state imaging device according to the present embodiment will be described with reference to FIG. 16. Furthermore, FIG. 17 shows a specific circuit configuration of each sensor cell in FIG. 16.

In the present embodiment, as shown in FIG. 17, in each cell, the LOD transistor TL is omitted. Therefore, as shown in FIG. 16, the vertical drive scanning circuit 65 for driving the LOD transistor is omitted from the circuit configuration of the entire solid-state imaging device.

Also in the present embodiment, the driving sequence is the same as that of FIG. 6 except that the PD clear period is not included. Namely, the accumulating period is set in a period common to all cells. The reading period (blanking period) includes the S (signal) modulation period, the clear period, and the N (noise) modulation period. Then, also in the present embodiment, the S modulation period, the clear period, and the N modulation period in the blanking period are, in terms of accumulation, the parallel accumulating period Ss at S modulation time, the parallel accumulating period Sc at clearing time, and the parallel accumulating period Sn at N modulation time, respectively. Moreover, the accumulating period includes, besides the parallel accumulating period in the same period as the blanking period, the single accumulating period Sa in which the single accumulating operation is carried out. One frame period is constituted by cyclically repeating the single accumulating period Sa and the parallel accumulating periods Ss, Sc, and Sn, after the transfer period.

Moreover, the photo-generated charges accumulated in the accumulation well 4 are transferred, in the transfer period, from the accumulation well 4 to the modulation well 5 so as to be held therein. All of the cells perform the transfer operation in the transfer period. Then, the period from this transfer period to the next transfer period becomes the accumulating period.

Next, with reference to FIGS. 18 and 19, the operation in the single accumulating period Sa, the transfer period, the S modulation period (parallel accumulating period Ss), the clear period (parallel accumulating period Sc) and the N modulation period (parallel accumulating period Sn), will be described based on the potential relationship. FIG. 18 is an explanatory diagram illustrating the potential relationship for each period with defining a direction along which the hole potential becomes higher as a positive side. FIG. 18A shows the condition at single accumulation time, FIG. 18B shows the condition at transfer time, FIG. 18C shows the condition at S modulation or N modulation (SIN modulation) time, and FIG. 18D shows the condition at clearing time. The column on the left side of FIG. 18 shows the condition of the read cell, and the column on the right side shows the condition of the non-read cell. In addition, FIG. 18 shows the potential change by the charges, with a satin pattern. The timing when each cell becomes the read cell is shown with the pulse portion of FIG. 20 to be described later.

FIG. 18 shows the potential relationship for each position with setting the position corresponding to the cut line of each cell of FIG. 14 in the horizontal axis, and setting the potential with reference to a hole in the vertical axis. From the left side to the right side in FIG. 18, the potentials in the substrate at the positions of the discharge contact region (Sub), the clear gate (CG) 14 (residual charges discharging channel portion), one end side of the carrier pocket (PKT) 10, the source (S), the other end side of the carrier pocket (PKT) 10, the transfer gate (TX) 13 (transfer channel RT portion), and the accumulation well region (PD) are shown.

Moreover, FIG. 19 shows changes of the driving voltage for each period. In FIG. 19, the dashed lines show changes of the driving voltage of the select line. FIG. 19 shows changes of the driving voltage for each period, however the actual driving sequence differs from the order of the periods to be set. FIG. 19 shows the setting of the driving voltage shown in FIG. 18 in time order.

In the present embodiment, the same driving is implemented for all cells in the single accumulating period Sa shown in FIG. 18A. As also shown in FIG. 19, in the single accumulating period Sa shown in FIG. 18A, 0.0 V is applied to the ring gate (RG) 6, 2.5 V is applied to the transfer gate (TX) 13, 2.5 V is applied to the clear gate 14, 1.0 T is applied to the drain D, and 1.0 V is applied to the source. The drain voltage is set to relatively low value.

In the single accumulating period, the potential barrier of the transfer channel RT between the accumulation well 4 and the modulation well 5 is made high sufficiently by the transfer transistor TT. The concentration in the accumulation well 4 is set relatively high, and its potential before the accumulation of the charges is relatively low. When the accumulation is started, the charges are generated by light entering from the opening region 2 of the photo diode PD so as to be accumulated in the accumulation well 4. FIG. 18A shows the potential increase by the accumulation of the charges, with a satin pattern.

Also in the present embodiment, the potential barrier of the transfer channel RT is so high (potential is high) that the charges generated by incident light are not transferred to the modulation well 5 but accumulated in the accumulation well 4.

In the transfer period shown in FIG. 18B, 0.0 V is applied to the ring gate (RG) 6, 0.0 V is applied to the transfer gate (TX) 13, 2.5 V is applied to the clear gate 14, 4.0 V is applied to the drain D, and 0.0 V is applied to the source.

Since 0 V is applied to the transfer gate 13, the potential barrier of the transfer channel RT becomes low enough. Thus, the charges accumulated in the accumulation well 4 in the above described single accumulating period Sa and the parallel accumulating periods Sa, Sc, and Sn to be described later, flow into the modulation well 5 through the transfer channel RT. By setting the drain voltage to a relatively high voltage, the potential gradient is increased so as to facilitate the transfer of the charges.

Meanwhile, the potential barrier of the discharge channel by the clear gate 14 is set to be high enough such that the charges held in the modulation well 5 do not flow into the discharge channel side. Moreover, also in the transfer period shown in FIG. 18B, all of the cells become the read cells, and the same driving is carried out.

The reading period includes the signal modulation (S modulation) period for mainly reading the signal component (S), the noise modulation (N modulation) period for mainly reading the noise component (N), and the clear period for clearing the residual charges in order to read the noise component. An image signal from which the variation by cells and the various kinds of noises are removed is obtained by reading and comparing the signal component and the noise component. Namely, in the reading period, the S modulation period, the clear period, and the N modulation period are carried out in this order.

The same control is carried out in the S modulation period and in the N modulation period. In the S/N modulation period shown in FIG. 18C, with respect to the read cell, as shown in the dashed line of FIG. 19, 2.5 V is applied to the ring gate (RG) 6, 2.5 V is applied to the transfer gate (TX) 13, 2.5 V is applied to the clear gate 14, and 2.5 V is applied to the drain D. Vg–Vths (=2.5–Vths) arises in the source (Vg is the gate voltage and Vths is the threshold voltage of the channel at S modulation time).

The reading is carried out for each line. Only each cell of one line (read line) out of all of the lines becomes a read cell, and each cell of other lines (non-read lines) is a non-read cell. Then, upon completion of reading of each read cell from the read line, the read line shifts and each cell of the next line becomes a read cell, and other cells become the non-read cells. Similarly, the reading (S modulation) of the signal component or the reading (N modulation) of the noise component is carried out while shifting the read lines.

As for the read cell, the potential barrier of the transfer channel RT by the transfer transistor TT is made high so that the charges held in the modulation well 5 may not flow into the accumulation well 4. Since the voltage of the ring gate 6 is made high, the source potential increases accordingly. The threshold voltage of the channel of the modulation transistor TM changes according to the charges held in the carrier pocket 10. Namely, the photo-generated charges accumulated in the accumulation well 4 of the photo diode PD are transferred to the carrier pocket 10, and thereby the source potential of the modulation transistor TM becomes one corresponding to the generation amount of the photo-generated charges, that is, incident light.

Meanwhile, as for the non-read cell, as shown in the solid line of FIG. 19, 0.0 V is applied to the ring gate (RG) 6, 2.5 V is applied to the transfer gate (TX) 13, 2.5 V is applied to the clear gate 14, and 2.5 V is applied to the drain D. Also in this case, Vg–Vth (=0–Vth) arises in the source, however, since the voltage of the ring gate 6 is low, the level of output of the non-read cell becomes sufficiently lower than that of the read cell. Therefore, only an output pixel signal of the read cell appears in the source line.

Since the difference in potential applied to the ring gate 6 is made large enough between the read cell and the non-read cell, even if, for example, an image is dark or the like, the output pixel signal of the read cell can be taken out from the source lines securely.

In the clear period shown in FIG. 18D, with respect to the read cell, as shown in the dashed line of FIG. 19, 1.5 V is applied to the ring gate (RG) 6, 2.5 V is applied to the transfer gate (TX) 13, 0.0 V is applied to the clear gate 14, 2.5 V is applied to the drain D, and 5.0 V is applied to the source.

Thus, the potential barrier of the discharge channel by the clear gate 14 is lowered sufficiently so as to flow the charges remaining in the modulation well 5 from the discharge channel into the discharge contact region 15. Accordingly, the photo-generated charges in the modulation well 5 are removed, enabling the reading (noise modulation) of the noise component.

Meanwhile, as for the non-read cell, as shown in the solid line of FIG. 19, 1.5 V is applied to the ring gate (RG) 6, 2.5 V is applied to the transfer gate (TX) 13, 2.5 V is applied to the clear gate 14, 2.5 V is applied to the drain D, and 5.0 V is applied to the source. Thus, the potential barrier of the residual charges discharging channel by the clear gate 14 still remains high. The reading of the non-read cell for which the blanking period in FIG. 6 has passed, out of the cells of each line, has already been completed, however, as for the non-read cells of lines before the blanking period passes, the reading has not been carried out yet. Therefore, as for the non-read cells, the potential barrier of the discharge channel by the clear gate 14 is kept high so as to prevent the charges from being discharged from the modulation well 5. The satin-pattern portion with respect to the non-read cell of FIG. 18 indicates that the charges that have not been read are held in the modulation well 5.

In the present embodiment, as described above, the parallel accumulating operation is carried out in the S/N modulation period and the clear period. FIGS. 18C and 18D show this parallel accumulating operation. Namely, in the reading period (SIN modulation and clear period), the photo-generated charges are accumulated in the accumulation well 4 by raising the potential barrier of the transfer channel RT. Thus, the reading period (modulation and clear period) of the modulation transistor TM corresponds to the accumulating period (parallel accumulating periods Ss, Sn, and Sc) for accumulating the photo-generated charges on the photo diode PD side. In the parallel accumulating periods Ss and Sn of FIG. 18C, and the parallel accumulating period Sc of FIG. 18D, the drain voltage is higher as compared with the single accumulating period Sa, and thus the conditions of accumulating the photo-generated charges differ. Moreover, as shown in FIGS. 18C and 18D, the conditions of accumulating the photo-generated charges differ slightly between the read cell and the non-read cell.

Thus, in the single accumulating period Sa, the S/N modulation period, and the clear period, accumulation of the photo-generated charges is carried out in all of the cells, and the accumulation time for each cell is approximately one frame period. In this way, the accumulation well 4 for accumulating charges that is formed on the photo diode PD side, and the modulation well 5 formed on the modulation transistor TM side are separately constituted, and the potential barrier of the transfer channel RT between both is controlled by the transfer transistor TT. Accordingly, the accumulation well 4 and the modulation well 5 can be set in the reading period and the parallel accumulating period during the same period, and thereby the frame rate can be enhanced.

Next, the operation sequence in each mode of the normal mode and the low-speed shutter mode will be described.

FIG. 20 is a timing chart showing the driving sequence. FIG. 20A shows the normal mode and FIG. 20B shows the low-speed shutter mode. In FIG. 20, the single accumulating period Sa (line-out period) and the blanking period are combined so as to be shown as one pulse shape.

In the normal mode of FIG. 20A, a period obtained by removing the transfer period from one frame period is the accumulating period in each cell, and the reading from all of the cells is completed in one frame period. Since the parallel accumulating period is set using a time common to the blanking period, it is not necessary to prepare another period for accumulation, and thereby the frame rate can be enhanced.

FIG. 20B shows the driving sequence of the low-speed shutter mode.

The low-speed shutter mode is used, for example, for making the accumulating period longer than one frame period. In the low-speed shutter mode according to the present embodiment, the transfer period is set once per a plurality of frame periods.

In an example of FIG. 20B, the transfer period is set once per two frame periods, and the next transfer period is set after two frame periods after the completion of this transfer period. Therefore, the accumulating period in this case is two frame periods. Accordingly, an image having almost twice the brightness as compared with the normal mode can be obtained. In the case of FIG. 20B, the reading from each cell is carried out only once per two frame periods, and therefore the frame rate becomes half of the normal mode.

Thus, also in the present embodiment, the same effect as the first embodiment can be obtained.

What is claimed is:

1. A solid-state imaging device, comprising:
   a substrate;
   a photoelectric conversion element in the substrate and generating photo-generated charges corresponding to incident light;
   an accumulation well accumulating the photo-generated charges;
   a modulation well holding the photo-generated charges transferred from the accumulation well;
   a modulation transistor having a channel threshold voltage that is controlled by the photo-generated charges held in the modulation well, and that outputs a pixel signal corresponding to the photo-generated charges;
   a transfer control element changing a potential barrier of a photo-generated charges transfer channel between the accumulation well and the modulation well to control transfering of the photo-generated charges;
   an unwanted charges discharging control element controlling a potential barrier of an unwanted charges discharging channel coupled to the accumulation well, the unwanted charges discharging control element discharging the photo-generated charges that overflow from the accumulation well through the unwanted charges discharging channel during a period other than a transfer period when the photo-generated charges are transferred from the accumulation well to the modulation well by the transfer control element; and
   a residual charges discharging control element controlling a potential barrier of a residual charges discharging channel coupled to the modulation well, and discharging residual charges in the modulation well through the residual charges discharging channel.

2. The solid-state imaging device according to claim 1, wherein the residual charges discharging control element controls the potential barrier of the residual charges discharging channel so as to discharge charges that overflow from the modulation well through the residual charges discharging channel, during a period other than the transfer period.

3. The solid-state imaging device according to claim 1, wherein the unwanted charges discharging control element determines an accumulating period of the photo-generated charges in the accumulation well by discharging the photo-generated charges accumulated in the accumulation well at a given timing.

4. The solid-state imaging device according to claim 1, wherein the residual charges discharging channel is substantially parallel to a surface of the substrate.

5. The solid-state imaging device according to claim 1, wherein the residual charges discharging channel and the unwanted charges discharging channel are electrically coupled to a wiring layer above the substrate.

6. A method of driving a solid-state imaging device, the solid-state imaging device including:
   an accumulation well that accumulates photo-generated charges generated by a photoelectric conversion element corresponding to incident light;
   a modulation well that controls a threshold voltage of a channel of a modulation transistor by holding the photo-generated charges;
   a transfer control element that controls a potential barrier of a transfer channel between the accumulation well and the modulation well;
   an unwanted charges discharging control element that controls a potential barrier of an unwanted charges discharging channel coupled to the accumulation well; and
   a residual charges discharging control element that controls a potential barrier of a residual charges discharging channel coupled to the modulation well,
   the method comprising:
   a single accumulation procedure for controlling potential barriers of the transfer channel and the unwanted charges discharging channel with the transfer control element and the unwanted charges discharging control element, so as to accumulate the photo-generated charges by the photoelectric conversion element into the accumulation well at least so that the photo-generated charges do not flow to the modulation well through the transfer channel;
   a reading procedure including:
      a signal component modulation procedure for, in a state in which the photo-generated charges are held in the modulation well by controlling the potential barriers of the residual charges discharging channel and the transfer channel with the residual charges discharging control element and the transfer control element, outputting a pixel signal corresponding to the photo-generated charges from the modulation transistor;
      a discharge procedure for discharging residual charges in the modulation well through the residual charges discharging channel by controlling the potential barrier of the residual charges discharging channel with the residual charges discharging control element; and
      a noise component modulation procedure for controlling the potential barriers of the residual charges discharging channel and the transfer channel with the residual charges discharging control element and the transfer control element, and reading a noise component from the modulation transistor after the discharge procedure;

a parallel accumulation procedure for, during the same period as the signal component modulation procedure, the discharge procedure, and the noise component modulation procedure, controlling the potential barriers of the transfer channel and the unwanted charges discharging channel with the transfer control element and the unwanted charges discharging control element so as to accumulate the photo-generated charges by the photoelectric conversion element into the accumulation well at least so that the photo-generated charges do not flow to the modulation well through the transfer channel; and a transfer procedure for controlling the potential barrier of the transfer channel with the transfer control element so as to transfer the photo-generated charges accumulated in the accumulation well to the modulation well and make the photo-generated charges be held therein.

7. The method of driving a solid-state imaging device according to claim 6, wherein the transfer procedure is carried out after the single accumulation procedure and the parallel accumulation procedure carried out in the same period as the reading procedure are repeated a number of times based on a number of lines in one screen.

8. The method of driving a solid-state imaging device according to claim 6, further comprising:

an initialization procedure for controlling the potential barriers of the transfer channel and the unwanted charges discharging channel with the transfer control element and the unwanted charges discharging control element during an arbitrary period within one screen period, so as to discharge the photo-generated charges accumulated in the accumulation well through the unwanted charges discharging channel, wherein the transfer procedure is carried out after the single accumulation procedure and the parallel accumulation procedure carried out in the same period as the reading procedure are repeated a number of times based on a number of lines in one screen and timing within the one screen period in the initialization procedure.

9. The method of driving a solid-state imaging device according to claim 8, further comprising a high-speed shutter mode in which a period from the initialization procedure to the transfer procedure is shorter than one screen period.

10. The method of driving a solid-state imaging device according to claim 8, further comprising a low-speed shutter mode in which a period from the initialization procedure to the transfer procedure is longer than one screen period.

* * * * *

UNITED STATES PATENT AND TRADEMARK OFFICE
CERTIFICATE OF CORRECTION

PATENT NO.      : 6,946,638 B2
APPLICATION NO. : 10/936226
DATED           : September 20, 2005
INVENTOR(S)     : Kazunobu Kuwazawa et al.

It is certified that error appears in the above-identified patent and that said Letters Patent is hereby corrected as shown below:

| | |
|---|---|
| Column 7, Line 28: | "bad" should be --by--. |
| Column 10, Line 27: | "——" should be -- – – – --. |
| Column 10, Line 39: | "P——" should be -- P– – --. |
| Column 10, Line 42: | "P——" should be -- P– – --. |
| Column 10, Line 43: | "P——" should be -- P– – --. |
| Column 10, Line 51: | "P——" should be -- P– – – --. |
| Column 10, Line 54: | "P——" should be -- P– – – --. |
| Column 10, Line 61: | "N——" should be -- N– – --. |
| Column 11, Line 1: | "N——" should be -- N– – --. |
| Column 11, Line 17: | "P——" should be -- P– – – --. |
| Column 11, Line 22: | "P——" should be -- P– – – --. |
| Column 11, Line 32: | "P——" should be -- P– – – --. |
| Column 11, Line 38: | "P——" should be -- P– – – --. |
| Column 24, Line 11: | "P——" should be -- P– – – --. |
| Column 24, Line 14: | "P——" should be -- P– – --. |
| Column 24, Line 18: | "P——" should be -- P– – --. |
| Column 24, Line 26: | "P——" should be -- P– – – --. |
| Column 24, Line 38: | "P——" should be -- P– – – --. |
| Column 24, Line 48: | "P——" should be -- P– – --. |
| Column 24, Line 51: | "N——" should be --N– – --. |

UNITED STATES PATENT AND TRADEMARK OFFICE
CERTIFICATE OF CORRECTION

PATENT NO. : 6,946,638 B2
APPLICATION NO. : 10/936226
DATED : September 20, 2005
INVENTOR(S) : Kazunobu Kuwazawa et al.

It is certified that error appears in the above-identified patent and that said Letters Patent is hereby corrected as shown below:

Column 24, Line 54:  "N———" should be --N– – --.

Column 25, Line 19:  "P———" should be -- P– – – --.

Column 28, Line 5:   "SIN" should be -- S/N--.

Column 28, Line 37:  "1.0 T" should be -- 1.0 V --.

Column 30, Line 34:  "SIN" should be -- S/N--.

Signed and Sealed this

Fifth Day of December, 2006

JON W. DUDAS
*Director of the United States Patent and Trademark Office*